(12) United States Patent
Cooper et al.

(10) Patent No.: US 10,680,645 B2
(45) Date of Patent: Jun. 9, 2020

(54) SYSTEM AND METHOD FOR DATA STORAGE, TRANSFER, SYNCHRONIZATION, AND SECURITY USING CODEWORD PROBABILITY ESTIMATION

(71) Applicant: AtomBeam Technologies Inc., Moraga, CA (US)

(72) Inventors: Joshua Cooper, Columbia, SC (US); Aliasghar Riahi, Orinda, CA (US); Mojgan Haddad, Orinda, CA (US); Ryan Kourosh Riahi, Orinda, CA (US); Razmin Riahi, Orinda, CA (US); Charles Yeomans, Orinda, CA (US)

(73) Assignee: ATOMBEAM TECHNOLOGIES INC., Moraga, CA (US)

( * ) Notice: Subject to any disclaimer, the term of this patent is extended or adjusted under 35 U.S.C. 154(b) by 0 days.

(21) Appl. No.: 16/573,883

(22) Filed: Sep. 17, 2019

(65) Prior Publication Data
US 2020/0007158 A1   Jan. 2, 2020

Related U.S. Application Data

(63) Continuation-in-part of application No. 16/200,466, filed on Nov. 26, 2018, now Pat. No. 10,476,519, which is a continuation-in-part of application No. 15/975,741, filed on May 9, 2018, now Pat. No. 10,303,391.

(60) Provisional application No. 62/578,824, filed on Oct. 30, 2017.

(51) Int. Cl.
| | | |
|---|---|---|
| *H03M 13/05* | (2006.01) | |
| *G06F 16/174* | (2019.01) | |
| *G06N 20/00* | (2019.01) | |

(52) U.S. Cl.
CPC ........ *H03M 13/05* (2013.01); *G06F 16/1752* (2019.01); *G06N 20/00* (2019.01)

(58) Field of Classification Search
None
See application file for complete search history.

(56) References Cited

U.S. PATENT DOCUMENTS

| | | | |
|---|---|---|---|
| 9,025,622 B1 | 5/2015 | Gubser | |
| 2009/0002207 A1* | 1/2009 | Harada | H03M 7/3086 341/51 |
| 2010/0223237 A1 | 9/2010 | Mishra et al. | |
| 2012/0078978 A1* | 3/2012 | Shoolman | H03M 7/3088 707/803 |
| 2014/0223118 A1 | 8/2014 | Ignomirello | |
| 2017/0250708 A1* | 8/2017 | Blaettler | H03M 7/42 |

* cited by examiner

*Primary Examiner* — Michael Alsip
(74) *Attorney, Agent, or Firm* — Brian R. Galvin; Galvin Patent Law LLC

(57) ABSTRACT

A system and method for data storage, transfer, synchronization, and security using recursive encoding, wherein data is deconstructed into chunklets, and is processed through a series of reference code libraries that reduce the data to a sequence of reference codes, and where the output of each reference library is used as the input to the next.

10 Claims, 22 Drawing Sheets

Fig. 20 global inputs:

A = universal constant that we can play with, maybe 1 to start delta = error probability (allowable uncertainty in answer, perhaps 1%)

epsilon = error tolerance (required accuracy of answer, perhaps 1%)

k = number of sourceblocks to include in codebook n = sourceblock length stream = incoming training data as a sequence of sourceblocks (binary vectors)

```
def hash(n,b,t,u):
    M = t X n matrix with uniform random entries from [1,b]
        return( lambda x: (M*x % b)*(u+1)-u )

def hashpair(n,b,t):
    h = hash(n,b,t,0)
    s = hash(n,2,t,1)
    return h,s def add(C,h,s,t,x):
    for i in range(t):
        C[i][h(x)[i]] += s(x)[i]

def estimate(C,h,s,t,x):
    return median([C[i][h(x)[i]]*s(x)[i] for i in range(t)])

% memory usage ~= tXb array of integers, each of which is <= maxcount
%               + heap of k key-value pairs (key is sourceblock, value is <= maxcount)
def findklargest(stream):
    t = ceil(A*log2(1/delta))
    b = ceil(3/epsilon^2)
    h,s = hashpair(n,b,t)
    C = [[0 for j in range(n)] for i in range(t)]
    countheap = heap()   % empty heap of key-value pairs
    for x in stream:
        add(C,h,s,t,x)
        if x in countheap:
            countheap[x] += 1
        elif estimate(C,h,s,t,x) > countheap.min_val:
            countheap.insert_key_value(x,1)
            countheap.evict(countheap.min_key)
    return countheap.to_dict()   % gives frequency list for most frequent k sourceblocks (approx'ly)
``` example use:

A = 1
delta = 0.01
epsilon = 0.01
n = 60
k = 100000
stream = open("training_data.bin")

freq_dict = findklargest(stream)
codebook = buildhuffman(freq_dict)
store(codebook)

SYSTEM AND METHOD FOR DATA STORAGE, TRANSFER, SYNCHRONIZATION, AND SECURITY USING CODEWORD PROBABILITY ESTIMATION

CROSS-REFERENCE TO RELATED APPLICATIONS

| application No. | Date Filed | Title |
| --- | --- | --- |
| Current application | Herewith | SYSTEM AND METHOD FOR DATA STORAGE, TRANSFER, SYNCHRONICATION, AND SECURITY USING CODEWORD ESTIMATION |
| | | Is a continuation-in-part of: |
| 16/200,466 | Nov. 26, 2018 | SYSTEM AND METHOD FOR HIGH-SPEED TRANSFER OF SMALL DATA SETS |
| | | which is a continuation-in-part of: |
| 15/975,741 Patent 10,303,391 | May 9, 2018 Issue Date May 28, 2019 | SYSTEM AND METHOD FOR DATA STORAGE, TRANSFER, SYNCHRONIZATION, AND SECURITY |
| | | which claims benefit of, and priority to: |
| 62/578,824 | Oct. 30, 2017 | MASSIVE DATA STORAGE, TRANSFER, SYNCHRONIZATION, AND SECURITY SYSTEM | the entire specification of each of which is incorporated herein by reference.

BACKGROUND OF THE INVENTION

Field of the Invention

The present invention is in the field of computer data storage and transmission, and in particular to the use of data encoding to reduce the size of data.

Discussion of the State of the Art

As computers become an ever-greater part of our lives, and especially in the past few years, data storage has become a limiting factor worldwide. Prior to about 2010, the growth of data storage far exceeded the growth in storage demand. In fact, it was commonly considered at that time that storage was not an issue, and perhaps never would be, again. In 2010, however, with the growth of social media, cloud data centers, high tech and biotech industries, global digital data storage accelerated exponentially, and demand hit the zettabyte (1 trillion gigabytes) level. Current estimates are that data storage demand will reach 50 zettabytes by 2020. By contrast, digital storage device manufacturers produced roughly 1 zettabyte of physical storage capacity globally in 2016. We are producing data at a much faster rate than we are producing the capacity to store it. In short, we are running out of room to store data, and need a breakthrough in data storage technology to keep up with demand.

The primary solutions available at the moment are the addition of additional physical storage capacity and data compression. As noted above, the addition of physical storage will not solve the problem, as storage demand has already outstripped global manufacturing capacity. Data compression is also not a solution. A rough average compression ratio for mixed data types is 2:1, representing a doubling of storage capacity. However, as the mix of global data storage trends toward multi-media data (audio, video, and images), the space savings yielded by compression either decreases substantially, as is the case with lossless compression which allows for retention of all original data in the set, or results in degradation of data, as is the case with lossy compression which selectively discards data in order to increase compression. Even assuming a doubling of storage capacity, data compression cannot solve the global data storage problem. The method disclosed herein, on the other hand, works the same way with any type of data.

Transmission bandwidth is also increasingly becoming a bottleneck. Large data sets require tremendous bandwidth, and we are transmitting more and more data every year between large data centers. On the small end of the scale, we are adding billions of low bandwidth devices to the global network, and data transmission limitations impose constraints on the development of networked computing applications, such as the "Internet of Things."

As part of the compression process, data is typically processed to encode the data into a different form. Efficient compression may be obtained by encoding the data according a measure of the frequency of various patterns of bits. Depending upon the size of data used to estimate the frequency of these data patterns may be computationally intensive both in the amount of operations performed and the amount of memory used.

Therefore, a need exists to provide data compression processes that efficiently estimate frequency of data patterns found in the data to be compressed as part of its training prior to define data encoding used in the compression processes.

SUMMARY OF THE INVENTION

The inventor has developed a system and method for data storage, transfer, synchronization, and security using code word frequency estimation.

According to a preferred embodiment, a system for storing, retrieving, and transmitting data in a highly compact format is disclosed. The system includes a reference code library generator, a data deconstruction engine, and a data reconstruction engine. The reference code library generator includes a count sketch engine and a Huffman tree creator generating a reference code library using a set of frequency data for a plurality of the most frequent data chunklets in the set of training data. The count sketch engine includes at least a processor, a memory, and a plurality of programming instructions stored in the memory and operable on the processor, wherein the programming instructions, when operating on the processor, cause the processor to receive a set of training data comprising a plurality of data chunklets, each chunk possesses an estimated frequency of occurrence, for each data chunklet within the set of training data, perform the following, update a set of hash tables corresponding to the data chunklet and a corresponding count of hash table entries, if the data chunklet is within a heap of data containing a set of the most frequent data chunklets, increment a count corresponding to the data chunked, if the data chunklet is not within the heap of data, estimate a frequency of occurrence for a value of the data chunklet, and add the data chunklet to the heap of data while evicting a data chunklet having a lowest frequency of occurrence in the heap of data when the estimated frequency of occurrence if greater than the lowest frequency of occurrence; and generate a set of frequency data for the set of the most frequent data chunklets in the set of training data using data stored in heap of data. The Huffman tree creator comprises at least a processor, a memory, and a plurality of programming instructions stored in the memory and operable on the processor, wherein the programming instructions, when operating on the processor, cause the processor to create a first Huffman binary tree based on the frequency of occurrences of each word in the set of training data, assign a Huffman codeword to each data chunklet in the set of training data according to the first Huffman binary tree; and construct the reference word library, wherein the word library stores the codewords and their corresponding words as key-value pairs in the library of key-value pairs. The reference code library comprises data chunklets and reference codes corresponding to the data chunklets. The data deconstruction engine comprises at least a processor, a memory, and a plurality of programming instructions stored in the memory and operable on the processor, wherein the programming instructions, when operating on the processor, cause the processor to receive run-time data, deconstruct the run time data into a run time set of data chunklets, retrieve the reference code for each chunklet from the reference code library, where there is no reference code for a given chunklet, create a reference code and store chunklet and its newly-created reference code in the reference code library, and create a plurality of warplets representing the data, each warplet comprising a reference code to a chunklet in the reference code library. The data reconstruction engine comprises a processor, a memory, and a plurality of programming instructions stored in the memory and operable on the processor, wherein the programming instructions, when operating on the processor, cause the processor to receive the plurality of warplets representing the data, retrieve the chunklet corresponding to the reference code in each warplet from the reference code library, and assemble the chunklets to reconstruct the data.

According to another preferred embodiment, a method for storing, retrieving, and transmitting data in a highly compact format is disclosed. The method receives a set of training data comprising a plurality of data chunklets, where each chunk possesses an estimated frequency of occurrence, counts occurrences for each value within a data chunklet, generates a set of frequency data for the set of the most frequent data chunklets in the set of training data using data stored in heap of data, generates a reference code library using set of frequency data for a plurality of the most frequent data chunklets in the set of training data, creates a reference code library comprising data chunklets and reference codes corresponding to the data chunklets, receives run time data, deconstructs the run time data into a plurality of run-time data chunklets, retrieves the reference code for each run-time data chunklet from the reference code library, where there is no reference code for a given run-time data chunklet, creates a reference code, and stores the run-time data chunklet and its newly-created reference code in the reference code library, creates a plurality of warplets representing the data, each warplet comprising a reference code to a chunklet in the library; receives the plurality of warplets representing the data, retrieves the run-time data chunklet corresponding to the reference code in each warplet from the reference code library, and assembles the run-time data chunklets to reconstruct the data. Counting occurrences for each value within a data chunklet for each training data chunklet within the set of training data, updates a set of hash tables corresponding to the training data chunklet and a corresponding count of hash table entries, if the training data chunklet is within a heap of data containing a set of the most frequent training data chunklets, increment a count corresponding to the training data chunklet, and if the training data chunklet is not within the heap of data, estimate a frequency of occurrence for a value of the training data chunklet, and add the training data chunklet to the heap of data while evicting a training data chunklet having a lowest frequency of occurrence in the heap of data when the estimated frequency of occurrence if greater than the lowest frequency of occurrence. The reference code library comprises training data chunklets and reference codes corresponding to the training data chunklets.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exemplary, and are not to be considered as limiting of the scope of the invention or the claims herein in any way.

FIG. 20 illustrates example pseudo code implementing code word frequency estimation as part generation of custom code word libraries.

DETAILED DESCRIPTION

Figure 1:
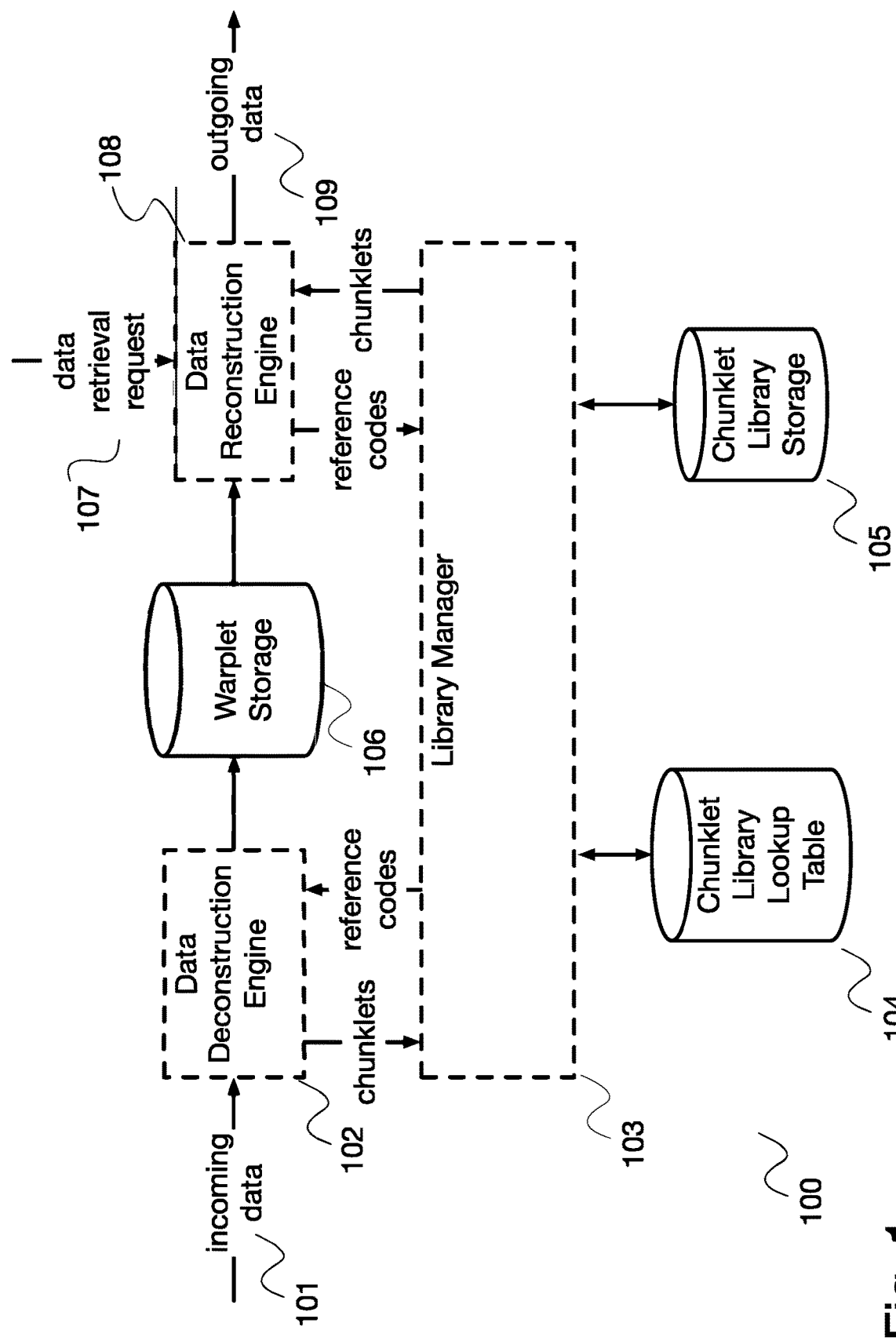
FIG. 1 is a diagram showing an embodiment of the system in which all components of the system are operated locally.

The inventor has conceived, and reduced to practice, various systems and methods for storage, synchronization, transfer, and protection of data in digital form using a library of data chunklets and reference codes to those chunklets.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

The term "bit" refers to the smallest unit of information that can be stored or transmitted. It is in the form of a binary digit (either 0 or 1). In terms of hardware, the bit is represented as an electrical signal that is either off (representing 0) or on (representing 1).

The term "byte" refers to a series of bits exactly eight bits in length.

The term "chunklet" refers to a series of bits of a specified length. The number of bits in a chunklet may be dynamically optimized by the system during operation. In one aspect, a chunklet may be of the same length as the block size used by a particular file system, typically 512 bytes or 4,096 bytes.

The terms "compression" and "deflation" as used herein mean the representation of data in a more compact form than the original dataset. Compression and/or deflation may be either "lossless", in which the data can be reconstructed in its original form without any loss of the original data, or "lossy" in which the data can be reconstructed in its original form, but with some loss of the original data.

The terms "compression factor" and "deflation factor" as used herein mean the net reduction in size of the compressed data relative to the original data (e.g., if the new data is 70% of the size of the original, then the deflation/compression factor is 30% or 0.3.)

The terms "compression ratio" and "deflation ratio", and as used herein all mean the size of the original data relative to the size of the compressed data (e.g., if the new data is 70% of the size of the original, then the deflation/compression ratio is 70% or 0.7.)

The term "data" means information in any computer-readable form.

A "database" or "data storage subsystem" (these terms may be considered substantially synonymous), as used herein, is a system adapted for the long-term storage, indexing, and retrieval of data, the retrieval typically being via some sort of querying interface or language. "Database" may be used to refer to relational database management systems known in the art, but should not be considered to be limited to such systems. Many alternative database or data storage system technologies have been, and indeed are being, introduced in the art, including but not limited to distributed non-relational data storage systems such as Hadoop, column-oriented databases, in-memory databases, and the like. While various aspects may preferentially employ one or another of the various data storage subsystems available in the art (or available in the future), the invention should not be construed to be so limited, as any data storage architecture may be used according to the aspects. Similarly, while in some cases one or more particular data storage needs are described as being satisfied by separate components (for example, an expanded private capital markets database and a configuration database), these descriptions refer to functional uses of data storage systems and do not refer to their physical architecture. For instance, any group of data storage systems of databases referred to herein may be included together in a single database management system operating on a single machine, or they may be included in a single database management system operating on a cluster of machines as is known in the art. Similarly, any single database (such as an expanded private capital markets database) may be implemented on a single machine, on a set of machines using clustering technology, on several machines connected by one or more messaging systems known in the art, or in a master/slave arrangement common in the art. These examples should make clear that no particular architectural approaches to database management is preferred according to the invention, and choice of data storage technology is at the discretion of each implementer, without departing from the scope of the invention as claimed.

The term "data set" refers to a grouping of data for a particular purpose. One example of a data set might be a word processing file containing text and formatting information.

The term "data heap" refers to a specialized tree-based data structure which is essentially an almost complete tree that satisfies a heap property: in a max heap, for any given node C, if P is a parent node of C, then a key (the value) of P is greater than or equal to the key of C. In a min heap, the key of P is less than or equal to the key of C. The node at the "top" of the heap (with no parents) is called the root node. The data heap is not a sorted structure; it can be regarded as being partially ordered; and is a useful data structure when it is necessary to repeatedly remove the object with the highest (or lowest) priority.

The term "effective compression" or "effective compression ratio" refers to the additional amount data that can be stored using the method herein described versus conventional data storage methods. Although the method herein described is not data compression, per se, expressing the additional capacity in terms of compression is a useful comparison.

The term "hash tables," or sometimes called a "hash map," refers to a data structure that implements an associative array abstract data type, a structure that can map keys to values. A hash table uses a hash function to compute an index into an array of buckets or slots, from which the desired value can be found.

The term "library" refers to a database containing chunklets each with a pattern of bits and reference code unique within that library. The term "codebook" is synonymous with the term library.

The term "warplet" refers to the reference code form in which data is stored or transmitted in an aspect of the system. A warplet consists of the reference code to a chunklet in the library plus an indication of that chunklet's location in a particular data set.

Conceptual Architecture

FIG. 1 is a diagram showing an embodiment 100 of the system in which all components of the system are operated locally. As incoming data 101 is received by data deconstruction engine 102. Data deconstruction engine 102 breaks the incoming data into chunklets, which are then sent to library manager 103. Using the information contained in chunklet library lookup table 104 and chunklet library storage 105, library manager 103 returns reference codes to data deconstruction engine 102 for processing into warplets, which are stored in warplet storage 106. When a data retrieval request 107 is received, data reconstruction engine 108 obtains the warplets associated with the data from warplet storage 106, and sends them to library manager 103. Library manager 103 returns the appropriate chunklets to data reconstruction engine 108, which assembles them into the proper order and sends out the data in its original form 109.

Figure 2:
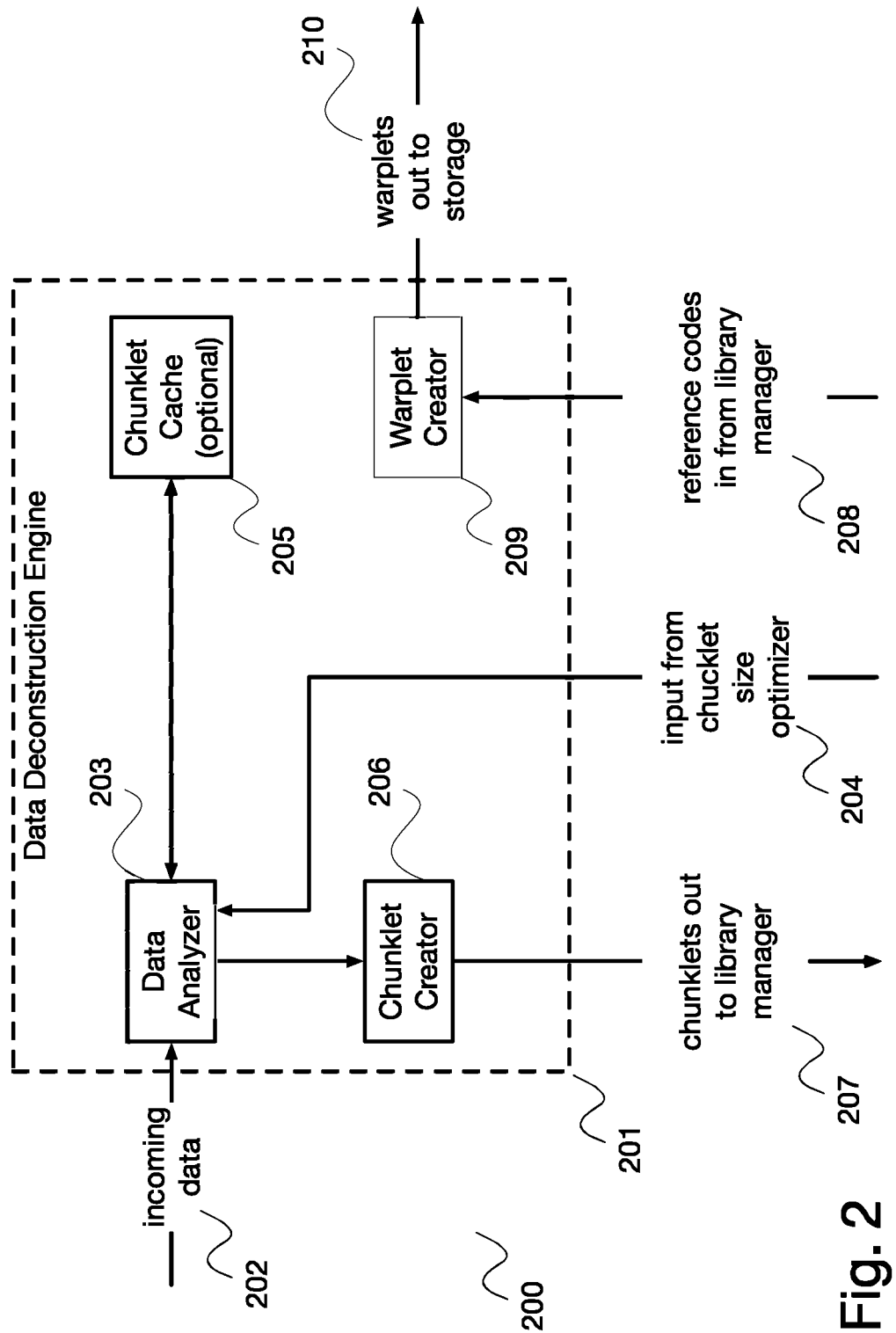
FIG. 2 is a diagram showing an embodiment of one aspect of the system, the data deconstruction engine.

FIG. 2 is a diagram showing an embodiment of one aspect 200 of the system, specifically data deconstruction engine 201. Incoming data 202 is received by data analyzer 203, which optimally analyzes the data based on machine learning algorithms and input 204 from a chunklet size optimizer, which is disclosed below. Data analyzer may optionally have access to a chunklet cache 205 of recently-processed chunklets, which can increase the speed of the system by avoiding processing in library manager 103. Based on information from data analyzer 203, the data is broken into chunklets by chunklet creator 206, which sends chunklets 207 to library manager 203 for additional processing. Data deconstruction engine 201 receives reference codes 208 from library manager 103, corresponding to the chunklets in the library that match the chunklets sent by chunklet creator 206, and warplet creator 209 processes the reference codes into warplets comprising a reference code to a chunklet and a location of that chunklet within the data set. The original data may be discarded, and the warplets representing the data are sent out to storage 210.

Figure 3:
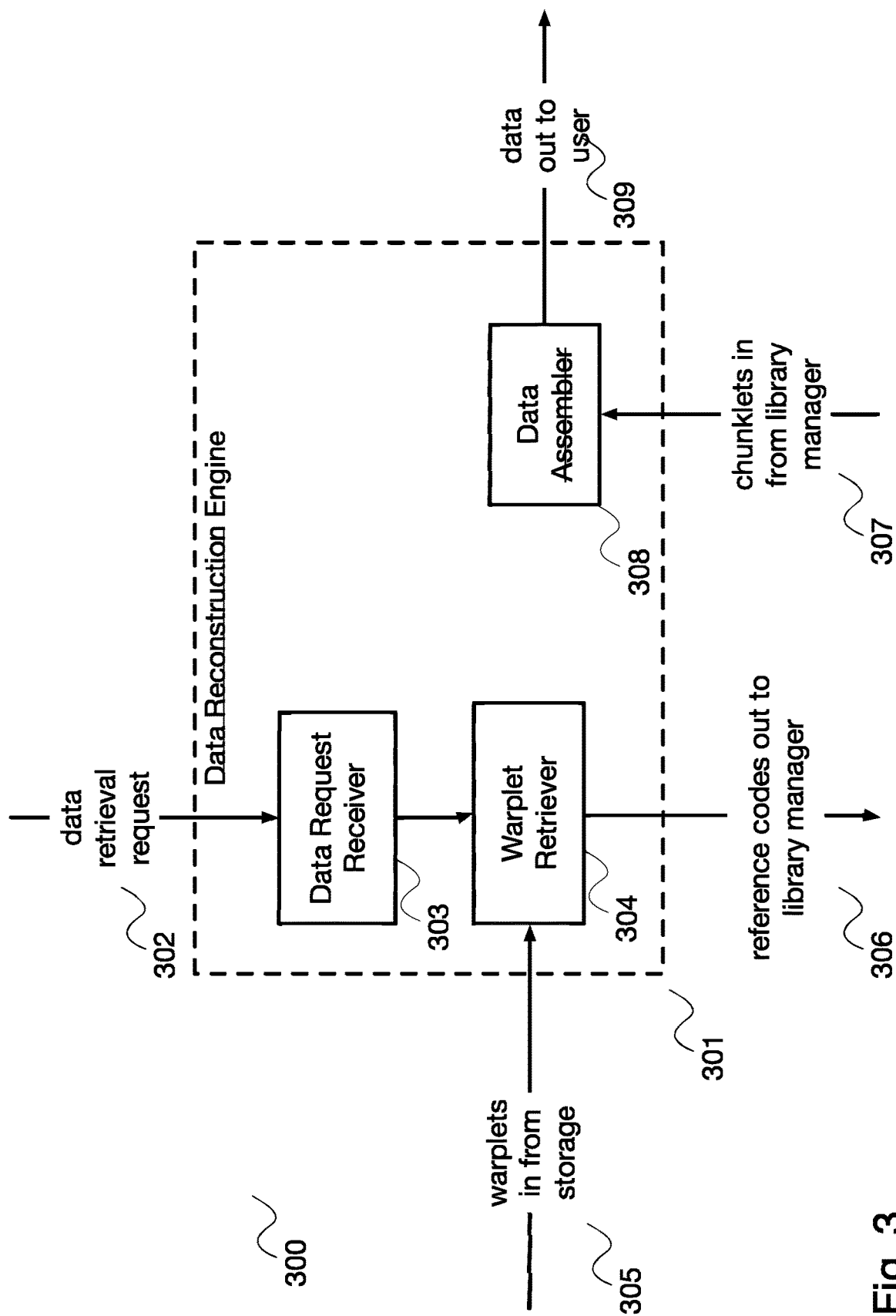
FIG. 3 is a diagram showing an embodiment of one aspect of the system, the data reconstruction engine.

FIG. 3 is a diagram showing an embodiment of another aspect of system 300, specifically data reconstruction engine 301. When a data retrieval request 302 is received by data request receiver 303 (in the form of a plurality of warplets corresponding to a desired final data set), it passes the information to data retriever 304, which obtains the requested data 305 from storage. Data retriever 304 sends, for each warplet received, a reference codes from the warplet 306 to library manager 103 for retrieval of the specific chunklet associated with the reference code. Data assembler 308 receives the chunklet 307 from library manager 103 and, after receiving a plurality of chunklets corresponding to a plurality of warplets, assembles them into the proper order based on the location information contained in each warplet (recall each warplet comprises a chunklet reference code and a location identifier that specifies where in the resulting data set the specific chunklet should be restored to. The requested data is then sent to user 309 in its original form.

Figure 4:
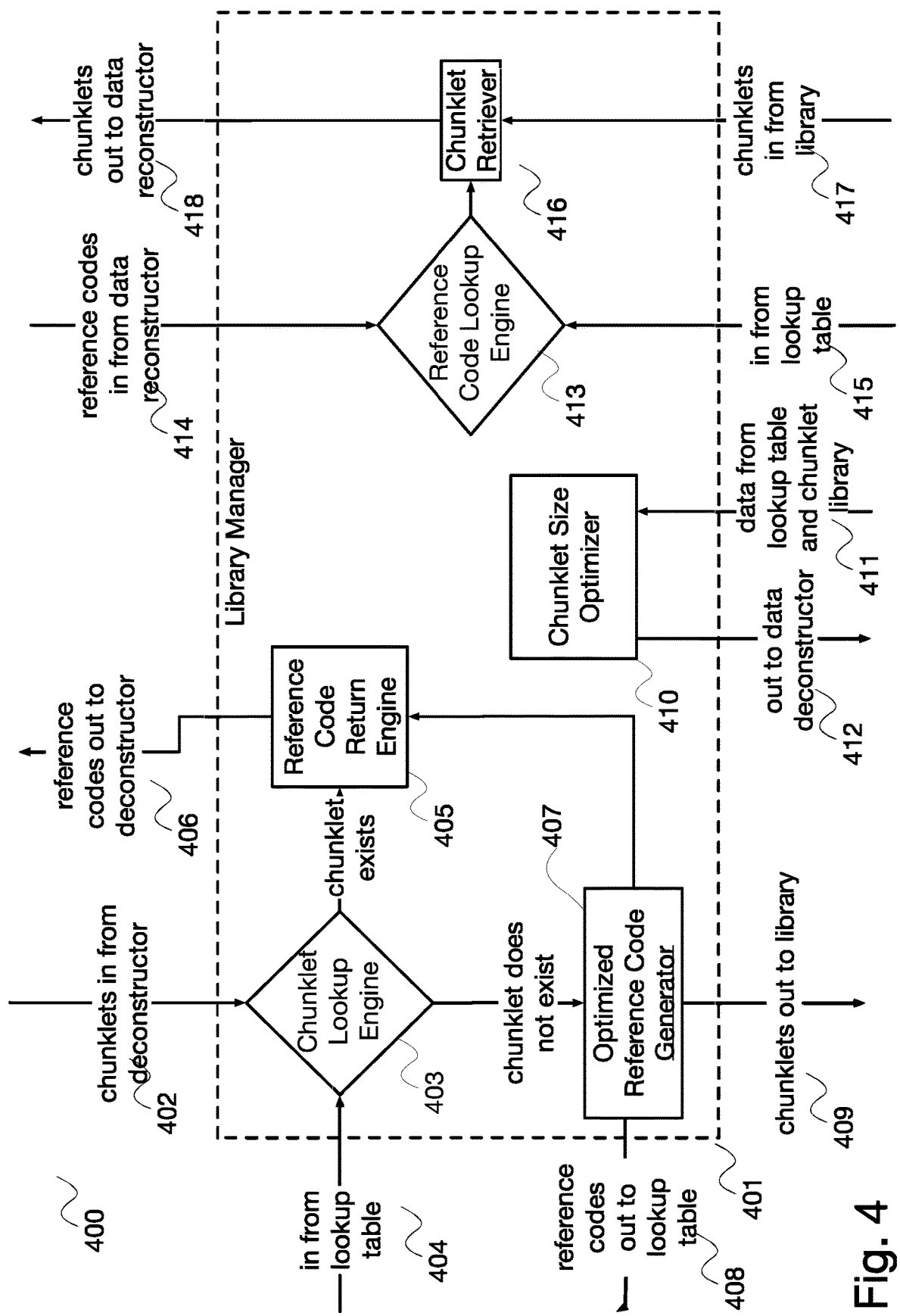
FIG. 4 is a diagram showing an embodiment of one aspect of the system, the library management module.

FIG. 4 is a diagram showing an embodiment of another aspect of the system 400, specifically library manager 401. One function of library manager 401 is to generate reference codes from chunklets received from data deconstruction engine 301. As chunklets are received 402 from data deconstruction engine 301, chunklet lookup engine 403 checks chunklet library lookup table 404 to determine whether those chunklets already exist in chunklet library storage 105. If a particular chunklet exists in chunklet library storage 105, reference code return engine 405 sends the appropriate reference code 406 to data deconstruction engine 301. If the chunklet does not exist in chunklet library storage 105, optimized reference code generator 407 generates a new, optimized reference code based on machine learning algorithms. Optimized reference code generator 407 then saves the reference code 408 to chunklet library lookup table 104; saves the associated chunklet 409 to chunklet library storage 105; and passes the reference code to reference code return engine 405 for sending 406 to data deconstruction engine 301. Another function of library manager 401 is to optimize the size of chunklets in the system. Based on information 411 contained in chunklet library lookup table 104, chunklet size optimizer 410 dynamically adjusts the size of chunklets in the system based on machine learning algorithms and outputs that information 412 to data analyzer 203. Another function of library manager 401 is to return chunklets associated with reference codes received from data reconstruction engine 301. As reference codes are received 414 from data reconstruction engine 301, reference code lookup engine 413 checks chunklet library lookup table 415 to identify the associated chunklets; passes that information to chunklet retriever 416, which obtains the chunklets 417 from chunklet library storage 105; and passes them 418 to data reconstruction engine 301.

Figure 5:
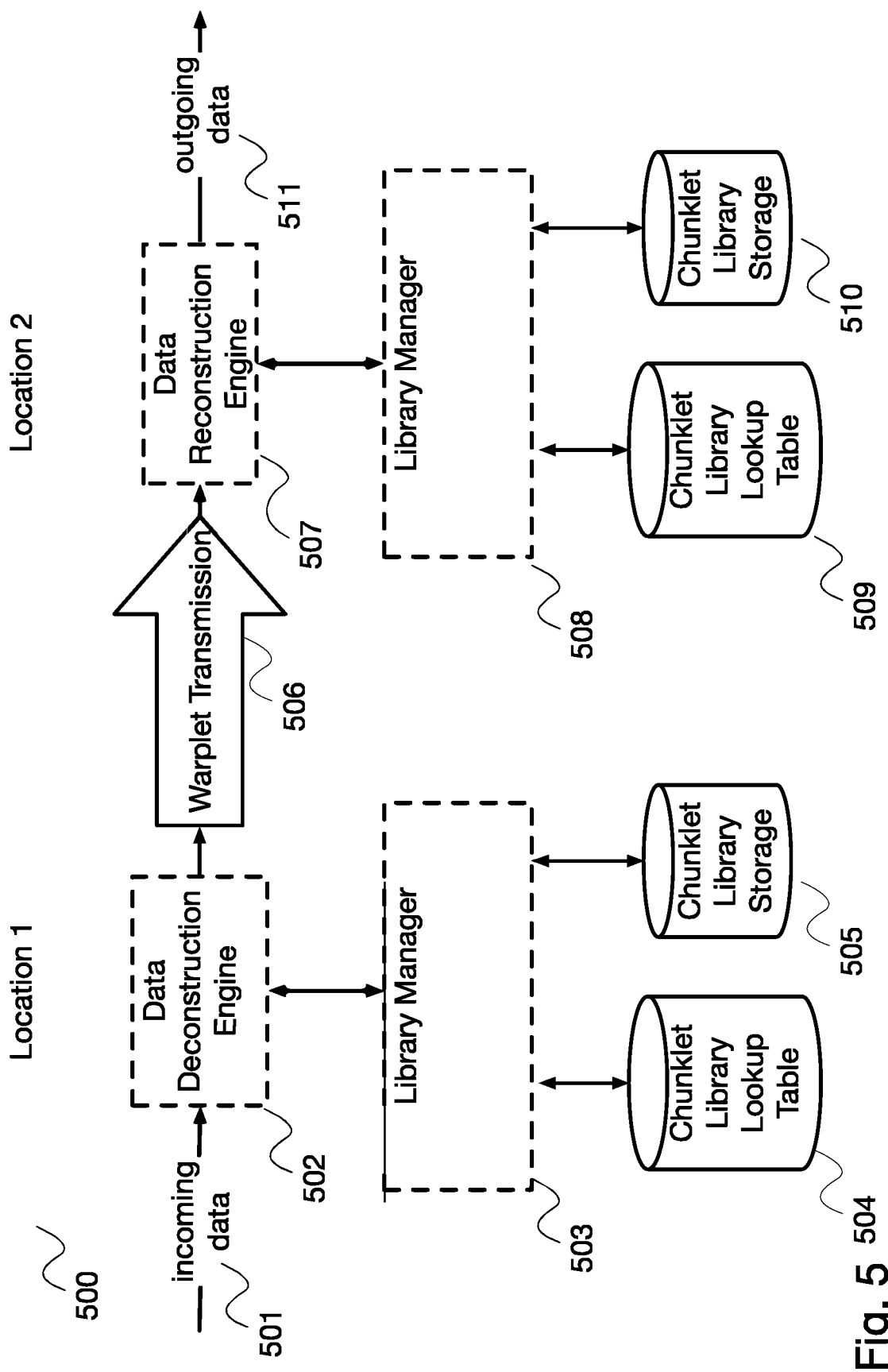
FIG. 5 is a diagram showing another embodiment of the system in which data is transferred between remote locations.

FIG. 5 is a diagram showing another embodiment of system 500, in which data is transferred between remote locations. As incoming data 501 is received by data deconstruction engine 502 at Location 1, data deconstruction engine 301 breaks the incoming data into chunklets, which are then sent to library manager 503 at Location 1. Using the information contained in chunklet library lookup table 504 at Location 1 and chunklet library storage 505 at Location 1, library manager 503 returns reference codes to data deconstruction engine 301 for processing into warplets, which are transmitted 506 to data reconstruction engine 507 at Location 2. In the case where the reference codes contained in a particular warplet have been newly generated by library manager 503 at Location 1, the warplet is transmitted along with a copy of the associated chunklet. As data reconstruction engine 507 at Location 2 receives the warplets, it passes them to library manager module 508 at Location 2, which looks up the chunklet in chunklet library lookup table 509 at Location 2, and retrieves the associated from chunklet library storage 510. Where a chunklet has been transmitted along with a warplet, the chunklet is stored in chunklet library storage 510 and chunklet library lookup table 504 is updated. Library manager 503 returns the appropriate chunklets to data reconstruction engine 507, which assembles them into the proper order and sends the data in its original form 511.

Figure 6:
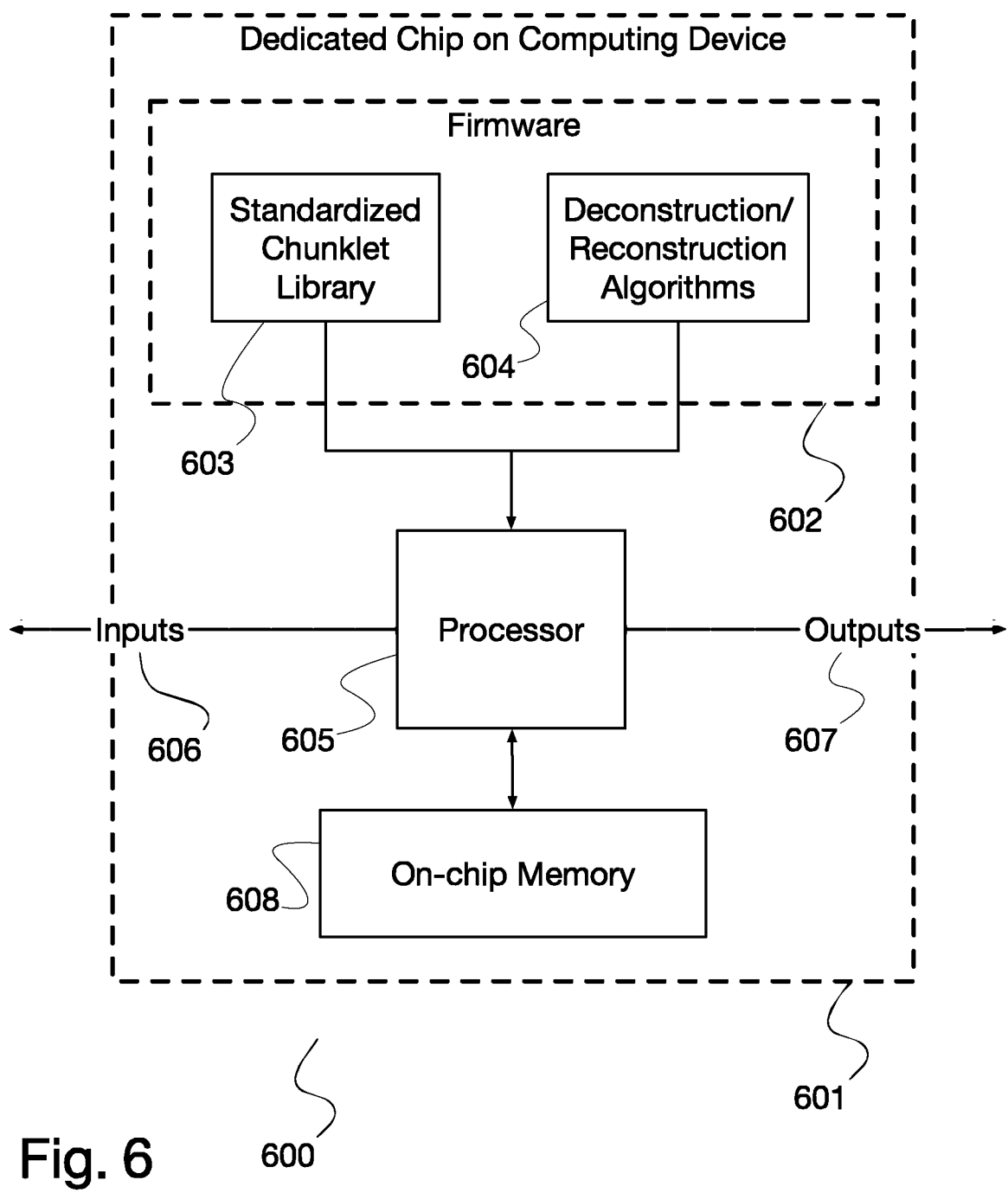
FIG. 6 is a diagram showing an embodiment in which a standardized version of the chunklet library and associated algorithms would be encoded as firmware on a dedicated processing chip included as part of the hardware of a plurality of devices.

FIG. 6 is a diagram showing an embodiment 600 in which a standardized version of a chunklet library 603 and associated algorithms 604 would be encoded as firmware 602 on a dedicated processing chip 601 included as part of the hardware of a plurality of devices 600. Contained on dedicated chip 601 would be a firmware area 602, on which would be stored a copy of a standardized chunklet library 603 and deconstruction/reconstruction algorithms 604 for processing the data. Processor 605 would have both inputs 606 and outputs 607 to other hardware on the device 600. Processor 605 would store incoming data for processing on on-chip memory 608, process the data using standardized chunklet library 603 and deconstruction/reconstruction algorithms 604, and send the processed data to other hardware on device 600. Using this embodiment, the encoding and decoding of data would be handled by dedicated chip 601, keeping the burden of data processing off device's 600 primary processors. Any device equipped with this embodiment would be able to store and transmit data in a highly optimized, bandwidth-efficient format with any other device equipped with this embodiment.

Figure 12:
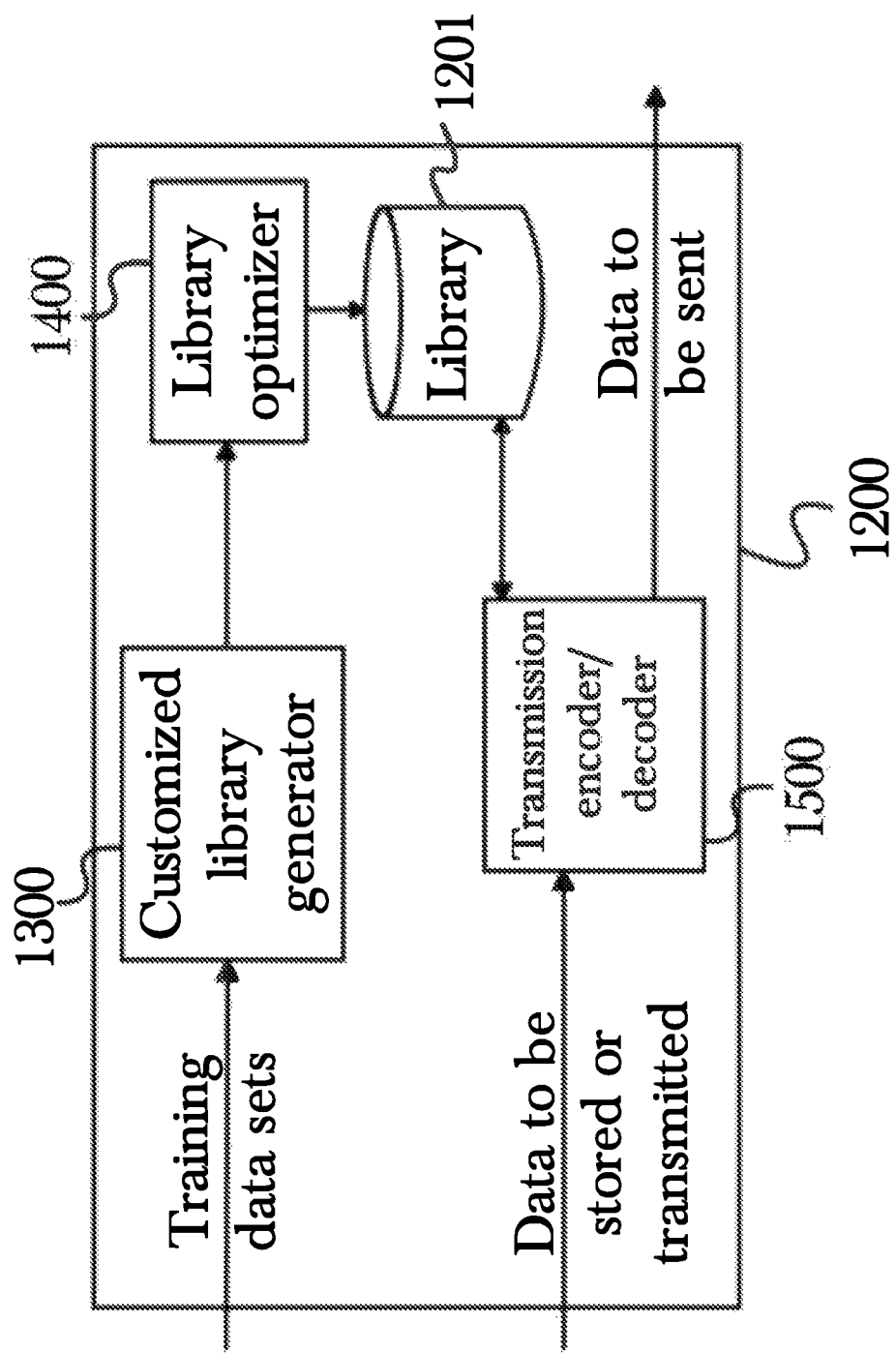
FIG. 12 is a diagram showing an exemplary system architecture, according to a preferred embodiment of the invention.

FIG. 12 is a diagram showing an exemplary system architecture 1200, according to a preferred embodiment of the invention. Incoming training data sets may be received at a customized library generator 1300 that processes training data to produce a customized word library 1201 comprising key-value pairs of data words (each comprising a string of bits) and their corresponding calculated binary Huffman codewords. The resultant word library 1201 may then be processed by a library optimizer 1400 to reduce size and improve efficiency, for example by pruning low-occurrence data entries or calculating approximate codewords that may be used to match more than one data word. A transmission encoder/decoder 1500 may be used to receive incoming data intended for storage or transmission, process the data using a word library 1201 to retrieve codewords for the words in the incoming data, and then append the codewords (rather than the original data) to an outbound data stream. Each of these components is described in greater detail below, illustrating the particulars of their respective processing and other functions, referring to FIGS. 2-4.

System 1200 provides near-instantaneous source coding that is dictionary-based and learned in advance from sample training data, so that encoding, and decoding may happen concurrently with data transmission. This results in computational latency that is near zero, but the data size reduction is comparable to classical compression. For example, if N bits are to be transmitted from sender to receiver, the compression ratio of classical compression is C, the ratio between the deflation factor of system 1200 and that of multi-pass source coding is p, the classical compression encoding rate is $R_C$ bit/s and the decoding rate is $R_D$ bit/s, and the transmission speed is S bit/s, the compress-send-decompress time will be $$T_{old} = \frac{N}{R_C} + \frac{N}{CS} + \frac{N}{CR_D}$$

while the transmit-while-coding time for system 1200 will be (assuming that encoding and decoding happen at least as Quickly as network latency):

$$T_{new} = \frac{N_p}{CS} \text{ so}$$

that the total data transit time improvement factor is $$\frac{T_{old}}{T_{new}} = \frac{\frac{CS}{R_C} + 1 + \frac{S}{R_D}}{p}$$

which presents a savings whenever $$\frac{CS}{R_C} + \frac{S}{R_D} > p - 1.$$

This is a reasonable scenario given that typical values in real-world practice are C=0.32, $R_C$=1.1·10$^{12}$, $R_D$=4.2·10$^{12}$, S=10$^{11}$, giving $$\frac{CS}{R_C} + \frac{S}{R_D} = 0.053 \dots,$$

such that system 1200 will outperform the total transit time of the best compression technology available as long as its deflation factor is no more than 5% worse than compression. Such customized dictionary-based encoding will also sometimes exceed the deflation ratio of classical compression, particularly when network speeds increase beyond 100 Gb/s.

The delay between data creation and its readiness for use at a receiving end will be equal to only the source word length t (typically 5-15 bytes), divided by the deflation factor C/p and the network speed S, i.e.

$$\text{delay}_{invention} = \frac{tp}{CS}$$

since encoding and decoding occur concurrently with data transmission. On the other hand, the latency associated with classical compression is $$\text{delay}_{priorart} = \frac{N}{R_C} + \frac{N}{CS} + \frac{N}{CR_D}$$

where N is the packet/file size. Even with the generous values chosen above as well as N=5128 t=10, and p=1.05, this results in delay$_{invention}$≈3.3·10$^{-10}$ while delay$_{priorart}$≈1.3·10$^{-7}$, a more than 400-fold reduction in latency.

A key factor in the efficiency of Huffman coding used by system 1200 is that key-value pairs be chosen carefully to minimize expected coding length, so that the average deflation/compression ratio is minimized. It is possible to achieve the best possible expected code length among all instantaneous codes using Huffman codes if one has access to the exact probability distribution of source words of a given desired length from the random variable generating them. In practice this is impossible, as data is received in a wide variety of formats and the random processes underlying the source data are a mixture of human input, unpredictable (though in principle, deterministic) physical events, and noise. System 1200 addresses this by restriction of data types and density estimation; training data is provided that is representative of the type of data anticipated in "real-world" use of system 1200, which is then used to model the distribution of binary strings in the data in order to build a Huffman code word library 1200.

Figure 13:
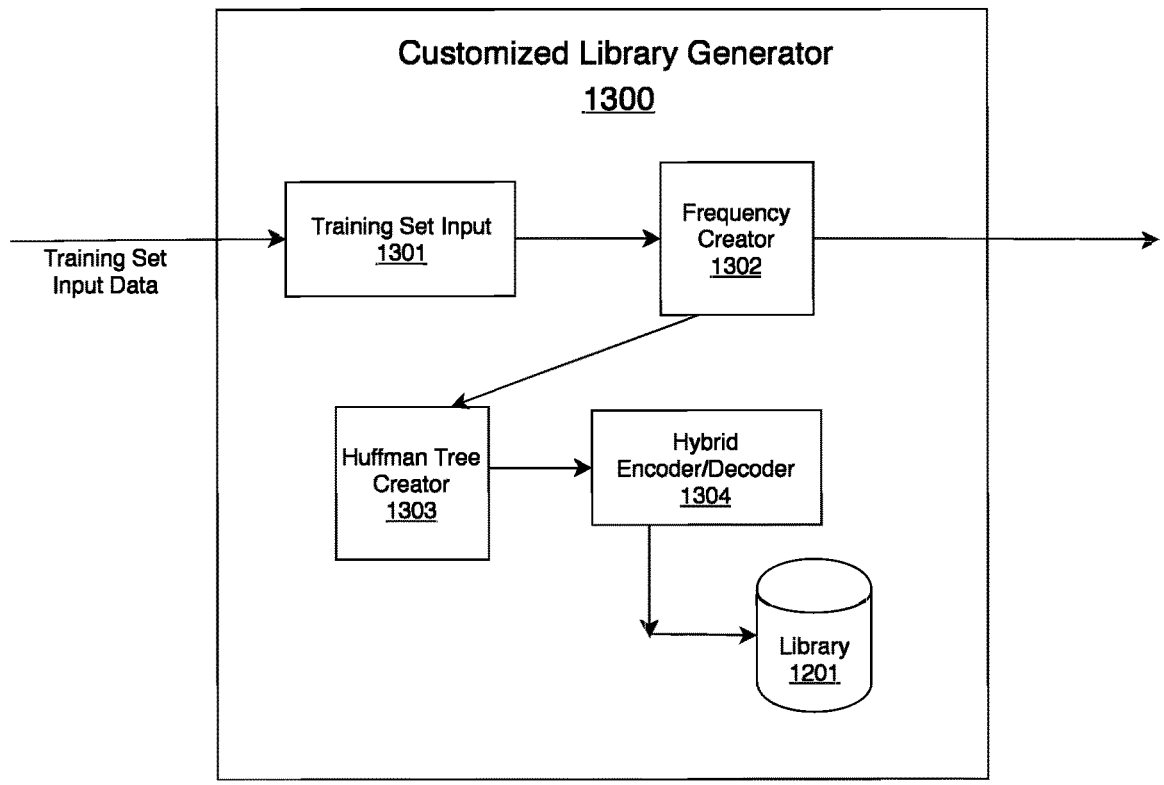
FIG. 13 are diagrams showing a more detailed architecture for a customized library generator.

FIG. 13 is a diagram showing a more detailed architecture for a customized library generator 1300. When an incoming training data set 1301 is received, it may be analyzed using a frequency creator 1302 to analyze for word frequency (that is, the frequency with which a given word occurs in the training data set). Word frequency may be analyzed by scanning all substrings of bits and directly calculating the frequency of each substring by iterating over the data set to produce an occurrence frequency, which may then be used to estimate the rate of word occurrence in non-training data. A first Huffman binary tree is created based on the frequency of occurrences of each word in the first dataset, and a Huffman codeword is assigned to each observed word in the first dataset according to the first Huffman binary tree. Machine learning may be utilized to improve results by processing a number of training data sets and using the results of each training set to refine the frequency estimations for non-training data, so that the estimation yield better results when used with real-world data (rather than, for example, being only based on a single training data set that may not be very similar to a received non-training data set). A second Huffman tree creator 1303 may be utilized to identify words that do not match any existing entries in a word library 1201 and pass them to a hybrid encoder/decoder 1304, that then calculates a binary Huffman codeword for the mismatched word and adds the codeword and original data to the word library 1201 as a new key-value pair. In this manner, customized library generator 1300 may be used both to establish an initial word library 1201 from a first training set, as well as expand the word library 1201 using additional training data to improve operation.

Figure 14:
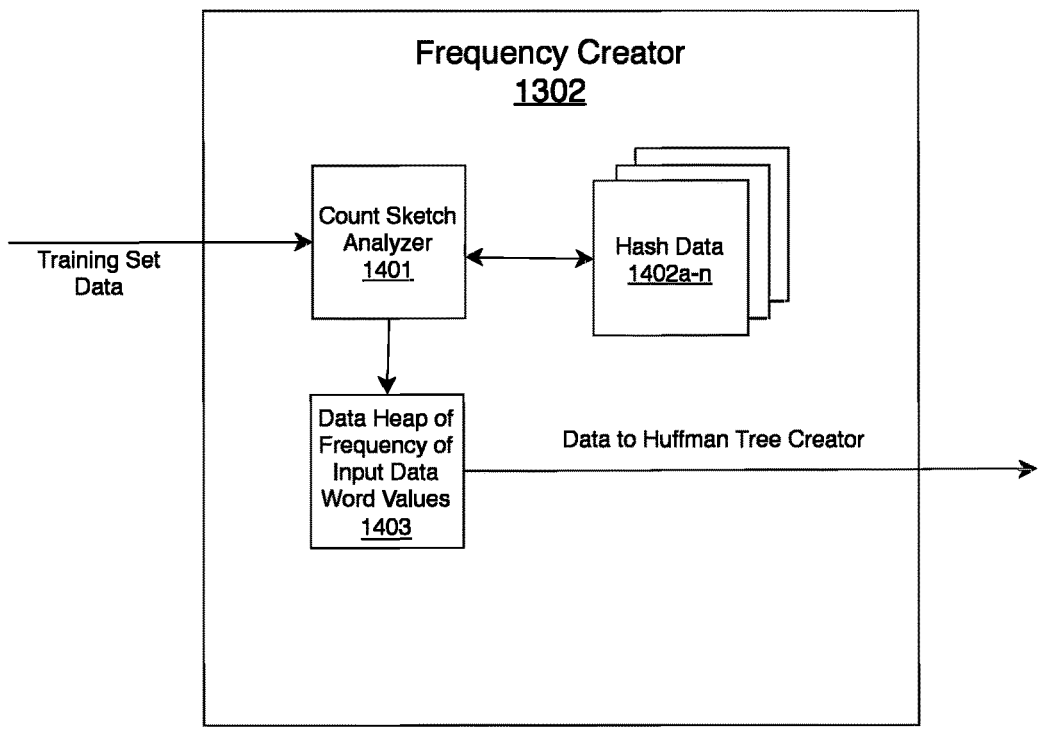
FIG. 14 are diagrams showing a more detailed architecture for a code word frequency estimator within an example customized library generator.

FIG. 14 are diagrams showing a more detailed architecture for a code word frequency creator within an example customized library generator. Frequency creator 1302 receives an arbitrarily large training data set to generate an estimate of a frequency of occurrence for a set of most frequent data values within training data chunklets within the training set data. The estimate of the frequency of occurrence for the most frequent data values may be used to generate a reference code library 1201 that may entirely be stored within RAM when used to process run-time data (meaning data processed during actual operations, as opposed to training data) while producing a highest amount of hits into its entries when doing so.

The most straightforward solution to finding a frequency of the data values found within all of a set of training data divided into training data chunklets is a sampling algorithm in which each data value seen when all of the training data chunklets have been processed is counted as they are processed. The resulting count values for each training data chunklet data values when divided by the total number of training data chunklets process corresponds to the frequency for each data value.

When each data chunklet contains n bits of data, the above sampling algorithm requires $2^n$ counters. One possible solution to reduce the number of counters needed is to limit the number of data values in which a frequency of occurrence is estimated is to limit the number of estimated frequencies to be limited to a number k. Because membership in a final k number of estimated frequencies is not known until all of the training data chunklets have been processed, a process is needed that estimates the most frequent data values, and thus entries in the list generated, as each training data chunklet is processed. Entries in the list generated are stored within a data heap 1403 by a count sketch analyzer 1401 as dynamically changing list of most frequent data values. More specifically, the heap of data comprises a list of chunklet data value entries of the most frequent data values from within extracted data chunklets, each chunklet data value entry comprises a data value, a count of occurrences, and an estimated frequency of occurrence value.

A known solution to finding the list of most frequent data values in the training data chunklets is to utilize a count sketch function, FindCandidateTop (S, k, l), where an input stream S, and integers k and l, are used to generate a list of l elements from S such that the k most frequent elements occur in the list. The count sketch function keeps a uniform random sample of the elements stored as a list of items plus a counter for each item. If the same object is added more than once, we simply increment its counter, rather than adding a new object to the list. If x is the size of the sample (counting repetitions), to ensure that an element with frequency fig appears in the sample, we need to set x/n, the probability of being included in the sample, to be $x/n > O(\log n/n_k)$, thus $x \, O(\log n/f_k)$. This guarantees that all top k elements will be in the sample, and thus gives a solution to FindCandidateTop (S, k, $O(\log n/f_k)$).

Recall that we would like a data structure that maintains the approximate counts of the high frequency elements in a stream and is compact.

First, consider the following simple algorithm for finding estimates of all Let s be a hash function from objects to $\{+1, -1\}$ and let c be a counter. While processing the stream, each time we encounter an item $q_i$, update the counter $c += s [q_i]$. The counter then allows us to estimate the counts of all the items since $E [c \cdot s [q_i]] = n_i$. However, it is obvious that there are a couple of problems with the scheme, namely that, the variance of every estimate is very large, and O (m) elements have estimates that are wrong by more than the variance.

The natural first attempt to fix the algorithm is to select hash functions $s_1, \ldots, s_t$ and keep t counters, $c_1, \ldots, c_t$. Then to process item $q_i$, we need to set $c_j += s_j [q_i]$, for each j. Note that we still have that each $E [ci \cdot s_j [q_i]] = n_i$. We can then take the mean or median of these estimates to achieve an estimate with lower variance.

However, collisions with high frequency items, like $o_1$, can spoil most estimates of lower frequency elements, even important elements like $o_k$. Therefore rather than having each element update every counter, each counter is replaced by a hash table of b counters and incrementing a single counter is replaced by having the receipt of particular data items update different subsets of counters, one per hash table. In this way, the hash table data is arranged so that every data value counted will get enough high-confidence estimates (i.e. those entries untainted by collisions with high-frequency elements) to estimate its frequency with sufficient precision.

As before, $E [h_r[q] \cdot s [q]] = n_q$. When b is large enough, the variance is reduced to a tolerable level, and that by making t large enough (i.e. approximately logarithmic in n), each of the m estimates have the desired variance. Let $h_1, \ldots, h_t$ be hash functions from objects to $\{1, \ldots, b\}$ and $s_1, \ldots, s_t$ be hash functions from objects to $\{+1, -1\}$. A count sketch data structure consists of these hash functions along with a t×b array of counters 1402a-n, which should be interpreted as an array of t hash tables, each containing b buckets.

The data structure supports two operations:
Add(C, q): For $i \in [1, t]$, $h_i[q] \, s_i[q]$.
Estimate(C, q): return $\text{median}_i \{h_i[q] \cdot s_i[q]\}$.

The above process has not eliminated the problem of collisions with high-frequency elements, these collisions will still spoil some subset of the estimates. A median of these elements is sufficiently robust while not being biased by high and low valued outliers. Using this data structure, the training set of data is processed. For each element, the count sketch data structure is used to estimate its count, and keep a heap 1403 of the top k elements seen so far. More formally:

Given a data stream $q_1, \ldots, q_n$, for each $j=1, \ldots, n$:
1. Add $(C, q_j)$
2. If $q_j$ is in the heap, increment its count. Else, add $q_j$ to the heap if Estimate $(C, q_j)$ is greater than the smallest estimated count in the heap. In this case, the smallest estimated count should be evicted from the heap.

This process solves a function, FindApproxTop (S, k, $\in$), where a choice of b will depend on $\in$. Also, notice that if two sketches share the same hash functions, and therefore the same b and t, that the two sketches may be add and subtract from each other. The above function, and its corresponding data structures, require space O(tb+k) to hold the count sketch data structures.

A method utilized by count sketch analyzer 1401 to implement the above function that generates the set of data values found in the training set data chunklets is discussed below in reference to FIG. 19. An example of pseudocode which implements the above count sketch process is illustrated in detail in FIG. 20.

Figure 15:
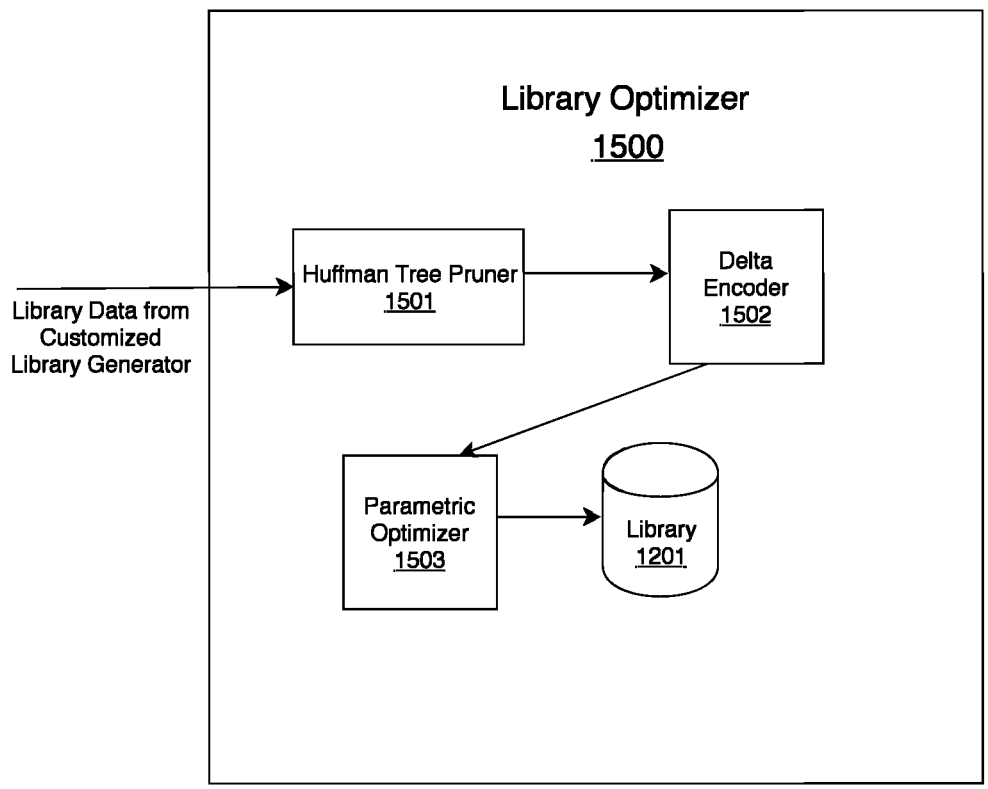
FIG. 15 is a diagram showing a more detailed architecture for a library optimizer.

FIG. 15 is a diagram showing a more detailed architecture for a library optimizer 1500. A pruner 1501 may be used to load a word library 1201 and reduce its size for efficient operation, for example by sorting the word library 1201 based on the known occurrence probability of each key-value pair and removing low-probability key-value pairs based on a loaded threshold parameter. This prunes low-value data from the word library to trim the size, eliminating large quantities of very-low-frequency key-value pairs such as single-occurrence words that are unlikely to be encountered again in a data set. Pruning eliminates the least-probable entries from word library 1201 up to a given threshold, which will have a negligible impact on the deflation factor since the removed entries are only the least-common ones, while the impact on word library size will be larger because samples drawn from asymptotically normal distributions (such as the log-probabilities of words generated by a probabilistic finite state machine, a model well-suited to a wide variety of real-world data) which occur in tails of the distribution are disproportionately large in counting measure. A delta encoder 1502 may be utilized to apply delta encoding to a plurality of words to store an approximate codeword as a value in the word library, for which each of the plurality of source words is a valid corresponding key. This may be used to reduce library size by replacing numerous key-value pairs with a single entry for the approximate codeword and then represent actual codewords using the approximate codeword plus a delta value representing the difference between the approximate codeword and the actual codeword. Approximate coding is optimized for low-weight sources such as Golomb coding, run-length coding, and similar techniques. The approximate source words may be chosen by locality-sensitive hashing, so as to approximate Hamming distance without incurring the intractability of nearest-neighbor-search in Hamming space. A parametric optimizer 1503 may load configuration parameters for operation to optimize the use of the word library 1201 during operation. Best-practice parameter/hyperparameter optimization strategies such as stochastic gradient descent, quasi-random grid search, and evolutionary search may be used to make optimal choices for all interdependent settings playing a role in the functionality of system 1200. In cases where lossless compression is not required, the delta value may be discarded at the expense of introducing some limited errors into any decoded (reconstructed) data.

Figure 16:
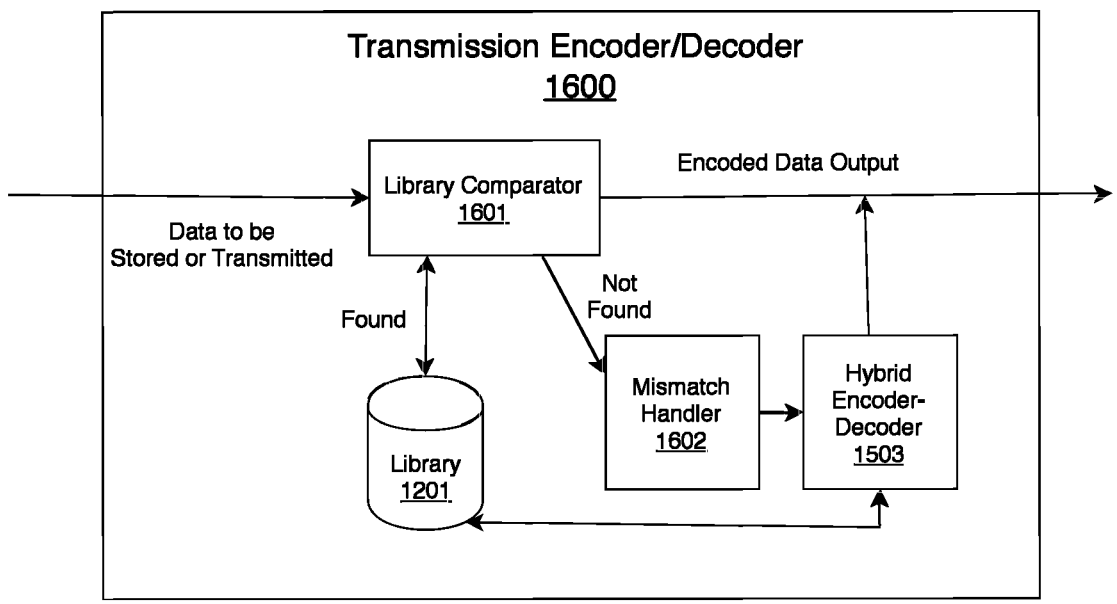
FIG. 16 is a diagram showing a more detailed architecture for a transmission and storage engine.

FIG. 16 is a diagram showing a more detailed architecture for a transmission encoder/decoder 1600. According to various arrangements, transmission encoder/decoder 1600 may be used to deconstruct data for storage or transmission, or to reconstruct data that has been received, using a word library 1201. A library comparator 1601 may be used to receive data comprising words or codewords, and compare against a word library 1201 by dividing the incoming stream into substrings of length t and using a fast hash to check word library 1201 for each substring. If a substring is found in word library 1201, the corresponding key/value (that is, the corresponding source word or codeword, according to whether the substring used in comparison was itself a word or codeword) is returned and appended to an output stream. If a given substring is not found in word library 1201, a mismatch handler 1602 and hybrid encoder/decoder 1603 may be used to handle the mismatch similarly to operation during the construction or expansion of word library 1201. A mismatch handler 1602 may be utilized to identify words that do not match any existing entries in a word library 1201 and pass them to a hybrid encoder/decoder 1503, that then calculates a binary Huffman codeword for the mismatched word and adds the codeword and original data to the word library 1201 as a new key-value pair. The newly-produced codeword may then be appended to the output stream. In arrangements where a mismatch indicator is included in a received data stream, this may be used to preemptively identify a substring that is not in word library 1201 (for example, if it was identified as a mismatch on the transmission end), and handled accordingly without the need for a library lookup.

Description of Method Aspects

Since the library consists of re-usable building chunklets, and the actual data is represented by reference codes to the library, the total storage space of a single set of data would be much smaller than conventional methods, wherein the data is stored in its entirety. The more data sets that are stored, the larger the library becomes, and the more data can be stored in reference code form.

As an analogy, imagine each data set as a collection of printed books that are only occasionally accessed. The amount of physical shelf space required to store many collections would be quite large, and is analogous to conventional methods of storing every single bit of data in every data set. Consider, however, storing all common elements within and across books in a single library, and storing the books as references codes to those common elements in that library. As a single book is added to the library, it will contain many repetitions of words and phrases. Instead of storing the whole words and phrases, they are added to a library, and given a reference code, and stored as reference codes. At this scale, some space savings may be achieved, but the reference codes will be on the order of the same size as the words themselves. As more books are added to the library, larger phrases, quotations, and other words patterns will become common among the books. The larger the word patterns, the smaller the reference codes will be in relation to them as not all possible word patterns will be used. As entire collections of books are added to the library, sentences, paragraphs, pages, or even whole books will become repetitive. There may be many duplicates of books within a collection and across multiple collections, many references and quotations from one book to another, and much common phraseology within books on particular subjects. If each unique page of a book is stored only once in a common library and given a reference code, then a book of 1,000 pages or more could be stored on a few printed pages as a string of codes referencing the proper full-sized pages in the common library. The physical space taken up by the books would be dramatically reduced. The more collections that are added, the greater the likelihood that phrases, paragraphs, pages, or entire books will already be in the library, and the more information in each collection of books can be stored in reference form. Accessing entire collections of books is then limited not by physical shelf space, but by the ability to reprint and recycle the books as needed for use.

The projected increase in storage capacity using the method herein described is primarily dependent on two factors: 1) the ratio of the number of bits in a block to the number of bits in the reference code, and 2) the amount of repetition in data being stored by the system.

With respect to the first factor, the number of bits used in the reference codes to the chunklets must be smaller than the number of bits in the chunklets themselves in order for any additional data storage capacity to be obtained. As a simple example, 16-bit chunklets would require $2^{16}$, or 65536, unique reference codes to represent all possible patterns of bits. If all possible 65536 blocks patterns are utilized, then the reference code itself would also need to contain sixteen bits in order to refer to all possible 65,536 blocks patterns. In such case, there would be no storage savings. However, if only 16 of those block patterns are utilized, the reference code can be reduced to 4 bits in size, representing an effective compression of 4 times (16 bits/4 bits=4) versus conventional storage. Using a typical block size of 512 bytes, or 4,096 bits, the number of possible block patterns is $2^{4,096}$, which for all practical purposes is unlimited. A typical hard drive contains one terabyte (TB) of physical storage capacity, which represents 1,953,125,000, or roughly $2^{31}$, 512 byte blocks. Assuming that 1 TB of unique 512-byte chunklets were contained in the library, and that the reference code would thus need to be 31 bits long, the effective compression ratio for stored data would be on the order of 132 times (4,096/31≈132) that of conventional storage.

With respect to the second factor, in most cases it could be assumed that there would be sufficient repetition within a data set such that, when the data set is broken down into chunklets, its size within the library would be smaller than the original data. However, it is conceivable that the initial copy of a data set could require somewhat more storage space than the data stored in a conventional manner, if all or nearly all chunklets in that set were unique. For example, assuming that the reference codes are $\frac{1}{10}^{th}$ the size of a full-sized copy, the first copy stored as chunklets in the library would need to be 1.1 megabytes (MB), (1 MB for the complete set of full-sized chunklets in the library and 0.1 MB for the reference codes). However, since the chunklets stored in the library are universal, the more duplicate copies of something you save, the greater efficiency versus conventional storage methods. Conventionally, storing 10 copies of the same data requires 10 times the storage space of a single copy. For example, ten copies of a 1 MB file would take up 10 MB of storage space. However, using the method described herein, only a single full-sized copy is stored, and subsequent copies are stored as reference codes. Each additional copy takes up only a fraction of the space of the full-sized copy. For example, again assuming that the reference codes are $\frac{1}{10}^{th}$ the size of the full-size copy, ten copies of a 1 MB file would take up only 2 MB of space (1 MB for the full-sized copy, and 0.1 MB each for ten sets of reference codes). The larger the library, the more likely that part or all of incoming data will duplicate chunklets already existing in the library.

The size of the library could be reduced in a manner similar to storage of data. Where chunklets differ from each other only by a certain number of bits, instead of storing a new chunklet that is very similar to one already existing in the library, the new chunklet could be represented as a reference code to the existing chunklet, plus information about which bits in the new block differ from the existing block. For example, in the case where 512 byte chunklets are being used, if the system receives a new chunklet that differs by only one bit from a chunklet already existing in the library, instead of storing a new 512 byte chunklet, the new chunklet could be stored as a reference code to the existing chunklet, plus a reference to the bit that differs. Storing the new chunklet as a reference code plus changes would require only a few bytes of physical storage space versus the 512 bytes that a full chunklet would require. The algorithm could be optimized to store new chunklets in this reference code plus changes form unless the changes portion is large enough that it is more efficient to store a new, full chunklet.

It will be understood by one skilled in the art that transfer and synchronization of data would be increased to the same extent as for storage. By transferring or synchronizing reference codes instead of full-sized data, the bandwidth requirements for both types of operations are dramatically reduced.

In addition, the method described herein is inherently a form of encryption. When the data is converted from its full form to reference codes, none of the original data is contained in the reference codes. Without access to the library of chunklets, it would be very difficult to re-construct any portion of the data from the reference codes. This inherent property of the method described herein could obviate the need for traditional encryption algorithms, thereby offsetting most or all of the computational cost of conversion of data back and forth to reference codes. In theory, the method described herein should not utilize any additional computing power beyond traditional storage using encryption algorithms. Alternatively, the method described herein could be in addition to other encryption algorithms to increase data security even further.

In other embodiments, additional security features could be added, such as: creating a proprietary library of chunklets for proprietary networks, physical separation of the reference codes from the library of chunklets, storage of the library of chunklets on a removable device to enable easy physical separation of the library and reference codes from any network, and incorporation of proprietary sequences of how chunklets are read and the data reassembled.

Figure 7:
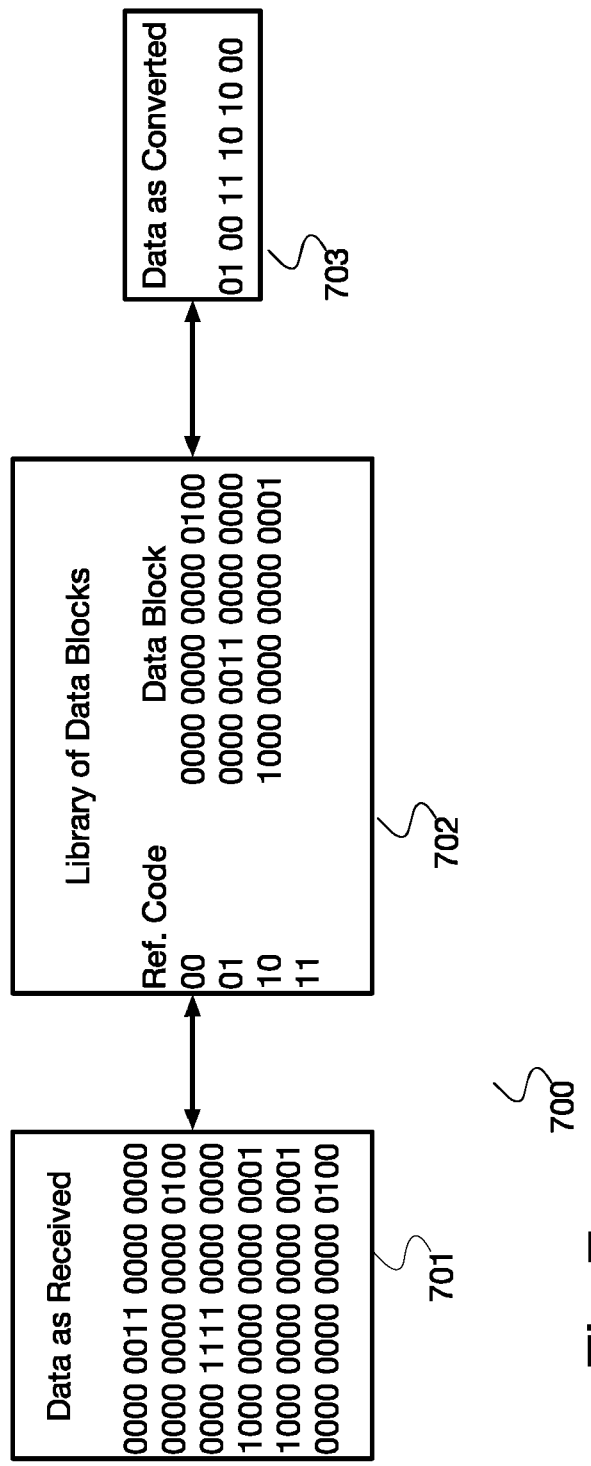
FIG. 7 is a diagram showing an example of how data might be converted into reference codes using an aspect of an embodiment.

FIG. 7 is a diagram showing an example of how data might be converted into reference codes using an aspect of an embodiment 700. As data is received 701, it is read by the processor in chunklets of a size dynamically determined by the previously disclosed chunklet size optimizer 410. In this example, each chunklet is 16 bits in length, and the library 702 initially contains three chunklets with reference codes 00, 01, and 10. The entry for reference code 11 is initially empty. As each 16 bit chunklet is received, it is compared with the library. If that chunklet is already contained in the library, it is assigned the corresponding reference code. So, for example, as the first line of data (0000 0011 0000 0000) is received, it is assigned the reference code (01) associated with that chunklet in the library. If that chunklet is not already contained in the library, as is the case with the third line of data (0000 1111 0000 0000) received in the example, that chunklet is added to the library and assigned a reference code, in this case 11. The data is thus converted 703 to a series of reference codes to chunklets in the library. The data is stored as a collection of warplets, each of which contains the reference code to a chunklet and information about the location of the chunklets in the data set. Reconstructing the data is performed by reversing the process. Each stored reference code in a data collection is compared with the reference codes in the library, the corresponding chunklet is read from the library, and the data is reconstructed into its original form.

Figure 8:
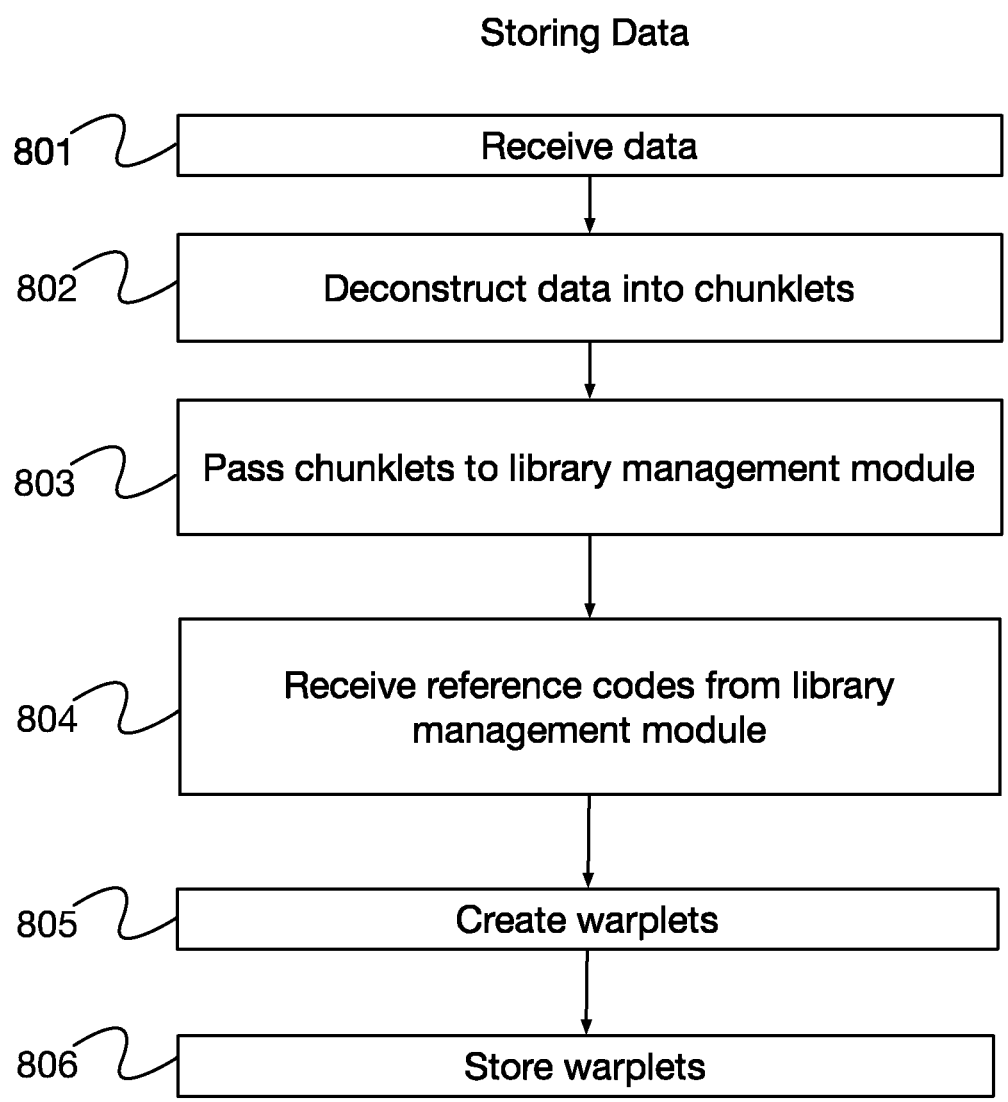
FIG. 8 is a method diagram showing the steps involved in using an embodiment to store data.

FIG. 8 is a method diagram showing the steps involved in using an embodiment 800 to store data. As data is received 801, it would be deconstructed into chunklets 802, and passed 803 to the library management module for processing. Reference codes would be received back 804 from the library management module, and could be combined with location information to create warplets 805, which would then be stored 806 as representations of the original data.

Figure 9:
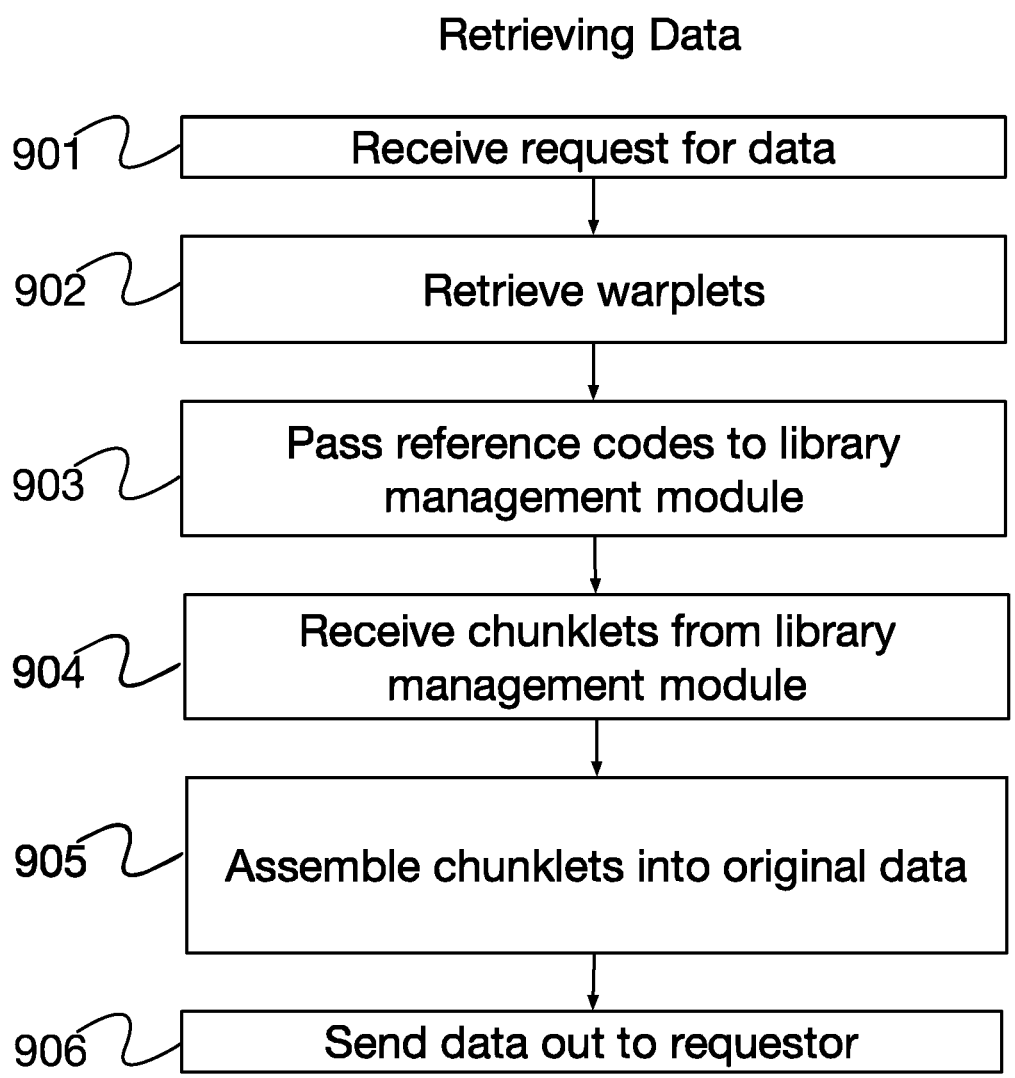
FIG. 9 is a method diagram showing the steps involved in using an embodiment to retrieve data.

FIG. 9 is a method diagram showing the steps involved in using an embodiment 900 to retrieve data. When a request for data is received 901, the associated warplets would be retrieved 902 from the library. The warplets would be passed 903 to the library management module, and the associated chunklets would be received back 904. Upon receipt, the chunklets would be assembled 905 into the original data using the location data contained in the warplets, and the reconstructed data would be sent out 906 to the requestor.

Figure 10:
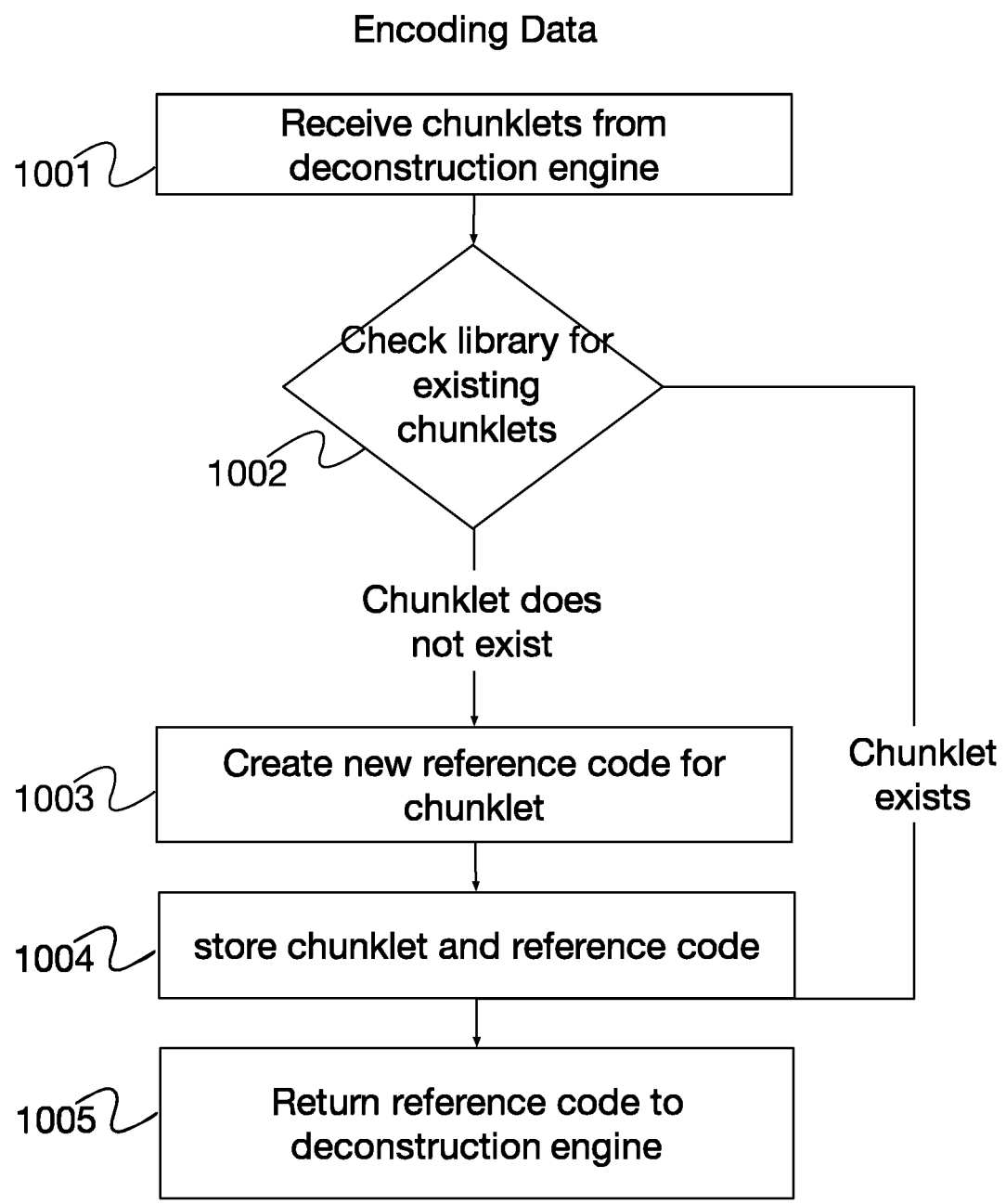
FIG. 10 is a method diagram showing the steps involved in using an embodiment to encode data.

FIG. 10 is a method diagram showing the steps involved in using an embodiment 1000 to encode data. As chunklets are received 1001 from the deconstruction engine, they would be compared 1002 with the chunklets already contained in the library. If that chunklet already exists in the library, the associated reference code would be returned 1005 to the deconstruction engine. If the chunklet does not already exist in the library, a new reference code would be created 1003 for the chunklet. The new reference code and its associated chunklet would be stored 1004 in the library, and the reference code would be returned to the deconstruction engine.

Figure 11:
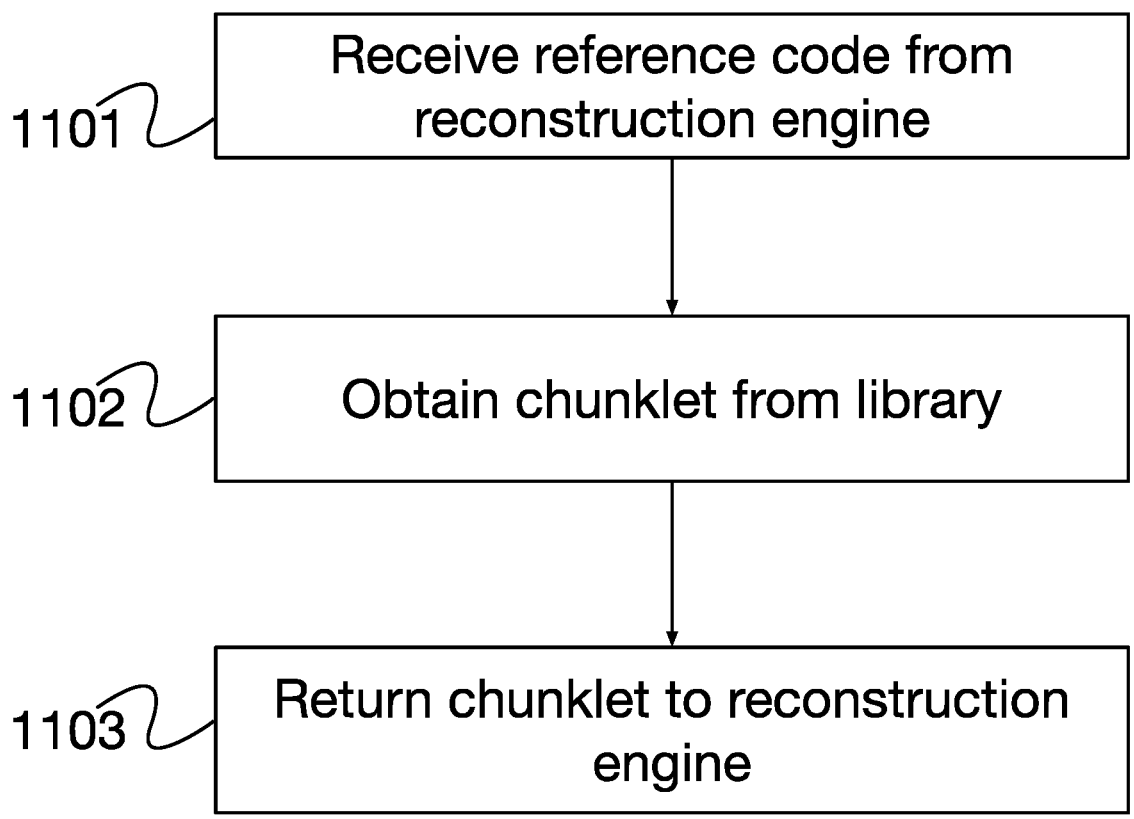
FIG. 11 is a method diagram showing the steps involved in using an embodiment to decode data.

FIG. 11 is a method diagram showing the steps involved in using an embodiment 1100 to decode data. As reference codes are received 1101 from the reconstruction engine, the associated chunklets are retrieved 1102 from the library, and returned 1103 to the reconstruction engine.

Figure 17:
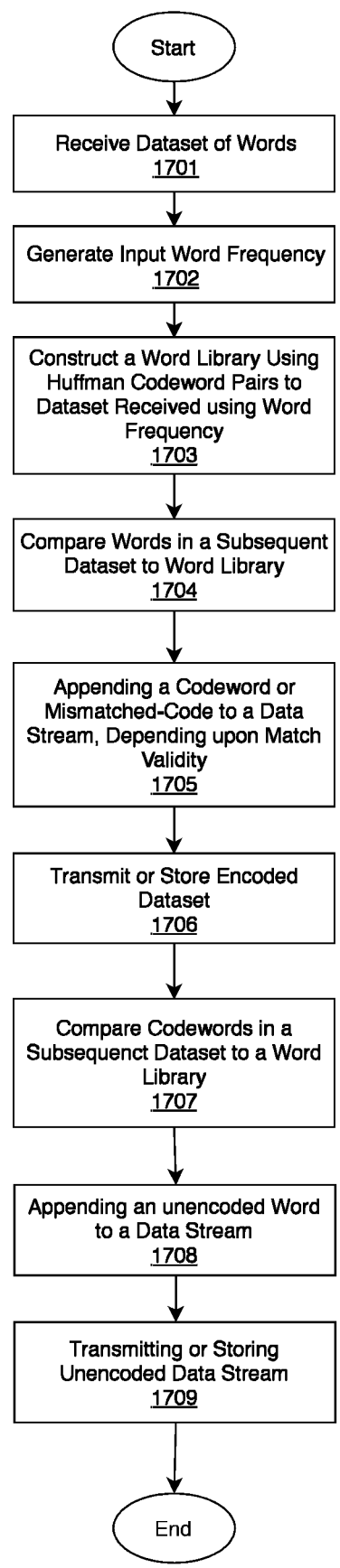
FIG. 17 is a method diagram illustrating key system functionality utilizing an encoder and decoder pair.

FIG. 17 is a method diagram illustrating key system functionality utilizing an encoder and decoder pair, according to a preferred embodiment. In a first step 1701, at least one incoming data set may be received at a customized library generator 1300 that then 1702 processes data to produce a customized word library 1201 comprising key-value pairs of data words (each comprising a string of bits) and their corresponding calculated binary Huffman codewords. A subsequent dataset may be received, and compared to the word library 1703 to determine the proper codewords to use in order to encode the dataset. Words in the dataset are checked against the word library and appropriate encodings are appended to a data stream 1704. If a word is mismatched within the word library and the dataset, meaning that it is present in the dataset but not the word library, then a mismatched code is appended, followed by the unencoded original word. If a word has a match within the word library, then the appropriate codeword in the word library is appended to the data stream. Such a data stream may then be stored or transmitted 1705 to a destination as desired. For the purposes of decoding, an already-encoded data stream may be received and compared 1706, and un-encoded words may be appended to a new data stream 1707 depending on word matches found between the encoded data stream and the word library that is present. A matching codeword that is found in a word library is replaced with the matching word and appended to a data stream, and a mismatch code found in a data stream is deleted and the following unencoded word is re-appended to a new data stream 1708, the inverse of the process of encoding described earlier. Such a data stream may then be stored or transmitted 1709 as desired.

Figure 18:
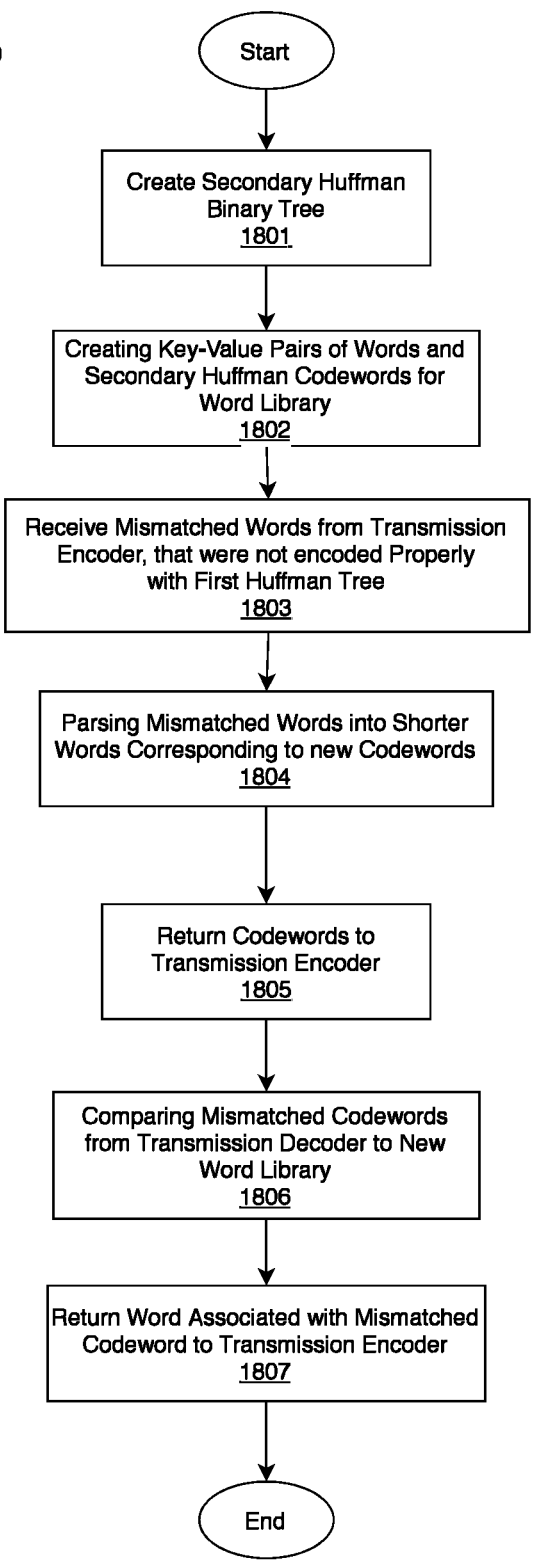
FIG. 18 is a method diagram illustrating possible use of a hybrid encoder/decoder to improve the compression ratio.

FIG. 18 is a method diagram illustrating possible use of a hybrid encoder/decoder to improve the compression ratio, according to a preferred aspect. A second Huffman binary tree may be created 1801, having a shorter maximum length of codewords than a first Huffman binary tree 1702, allowing a word library to be filled with every combination of codeword possible in this shorter Huffman binary tree 1802. A word library may be filled with these Huffman codewords and words from a dataset 1802, such that a hybrid encoder/decoder 1304, 1603 may receive any mismatched words from a dataset for which encoding has been attempted with a first Huffman binary tree 1803, 1704 and parse previously mismatched words into new partial codewords (that is, codewords that are each a substring of an original mismatched codeword) using the second Huffman binary tree 1804. In this way, an incomplete word library may be supplemented by a second word library. New codewords attained in this way may then be returned to a transmission encoder 1805, 1600. In the event that an encoded dataset is received for decoding, and there is a mismatch code indicating that additional coding is needed, a mismatch code may be removed and the unencoded word used to generate a new codeword as before 1806, so that a transmission encoder 1600 may have the word and newly generated codeword added to its word library 1807, to prevent further mismatching and errors in encoding and decoding.

It will be recognized by a person skilled in the art that the methods described herein can be applied to data in any form. For example, the method described herein could be used to store genetic data, which has four data units: C, G, A, and T. Those four data units can be represented as 2-bit sequences: 00, 01, 10, and 11, which can be processed and stored using the method described herein.

It will be recognized by a person skilled in the art that certain embodiments of the methods described herein may have uses other than data storage. For example, because the data is stored in reference code form, it cannot be reconstructed without the availability of the library of chunklets. This is effectively a form of encryption, which could be used for cyber security purposes. As another example, an embodiment of the method described herein could be used to store backup copies of data, provide for redundancy in the event of server failure, or provide additional security against cyberattacks by distributing multiple partial copies of the library among computers are various locations, ensuring that at least two copies of each chunklet exist in different locations within the network.

Figure 19:
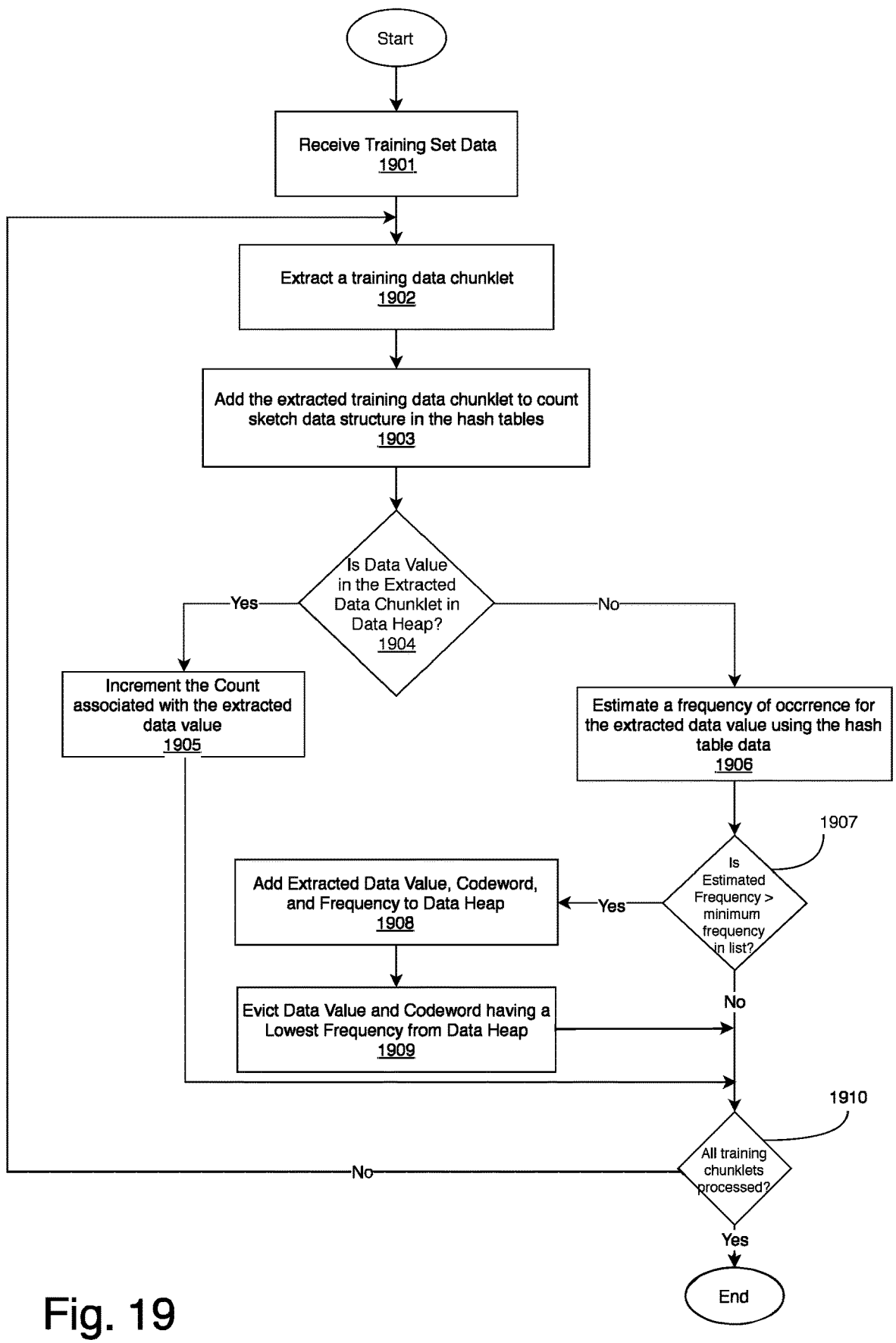
FIG. 19 illustrates is a method diagram illustrating a possible implementation for code word frequency estimation as part generation of custom code word libraries.

FIG. 19 illustrates is a method diagram illustrating one possible implementation for code word frequency estimation as part generation of custom code word libraries (also known as reference code libraries). The process begins and the training set data is received from a source, either a storage device or a communications channel from a remote device in step 1901. The training set data may be received in a set of large blocks of data if the data set is too large to be stored as an entire data set, or as the entire data set.

The received training set data is broken into chunklets with each data chunklet extracted to be processed individually in step 1902. Each data chunklet contains a sequence of data bits which represents a data value to be encoded into a different sequence of bits when data is compressed. Once extracted, each data chunklet is added to the count sketch data structure of hash tables 1402*a-n*.

In step 1903, when a data chunklet is added to the count sketch data structure of hash tables 1402*a-n*, the data value in the extracted data chunklet is used as a key into hash functions that defined the count sketch data structure of hash tables 1402*a-n*. The hash value is an index to a counter stored within the count sketch data structure of hash tables 1402*a-n* that counts the number of occurrences processed for all of the data values that generate the same hash value. When a first occurrence of the data value is processed, the extracted data value is added to the hash tables. As discussed above, a plurality of different tables are used with each data value being mapped to a differing subset of these tables. The count is incremented for each counter associated with the data value, where each pair corresponds to a single counter per hash table.

Once the extracted data chunklet has been added to the count sketch data structure of hash tables 1402*a-n*, the extracted data value is checked to determine whether the data value has already been stored into the data heap 1403 that contains a list of the data values having the highest frequency of occurrence in step 1904. If step 1904 determines that the extracted data value is currently in the data heap 1403, the method increments a count of occurrences within the count sketch data structure of hash tables 1402*a-n* in step 1905 before determining whether all of the data chunklets have been processed in step 1910.

If all of the data chunklets have been processed, the method ends with a list of the data values having the highest estimated frequency of occurrences is stored in the data heap 1403. If step 1910 determines more data chunklets are to be processed, the method returns to step 1902 to extract and process the next data chunklet until all of the data chunklets are completed.

Returning to step 1904, if the extracted data value is not currently in the count sketch data structure of hash tables 1402*a-n*, in step 1906 the method estimates a frequency of occurrence for the data value using the number of occurrences for that particular data value in the count sketch data structure of hash tables 1402*a-n*. This estimate for a frequency of occurrence for the extracted data value is compared with the lowest frequency of occurrence for data values currently in the data heap 1403. The lowest frequency of occurrence is equal to zero until the data heap 1403 contains a predefined number of entries to be included in list of most frequent data chunklets.

If the estimate for a frequency of occurrence for the extracted data value less than the lowest value as determined in step 1907, the extracted data value is not now in the list of most frequent data chunklets. The processing continues to determine if more data chunklets are to be processed in step 1910. If the estimate for a frequency of occurrence for the extracted data value greater than the lowest value as determined in step 1907, the extracted data value and its estimated frequency of occurrence is inserted in the data heap 1403 in step 1908 and data value and its corresponding lowest frequency of occurrence is evicted from the data heap 1403 in step 1909. Once the data heap has been updated, the step 1910 determines whether the processing returns to step 1902 to continue with the next data chunklet or ends. An example of pseudocode which implements the above count sketch process is illustrated in detail in FIG. 20.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the aspects disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific aspects, at least some of the features or functionalities of the various aspects disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some aspects, at least some of the features or functionalities of the various aspects disclosed herein may be implemented in one or more virtualized computing environments (e.g., network computing clouds, virtual machines hosted on one or more physical computing machines, or other appropriate virtual environments).

Figure 21:
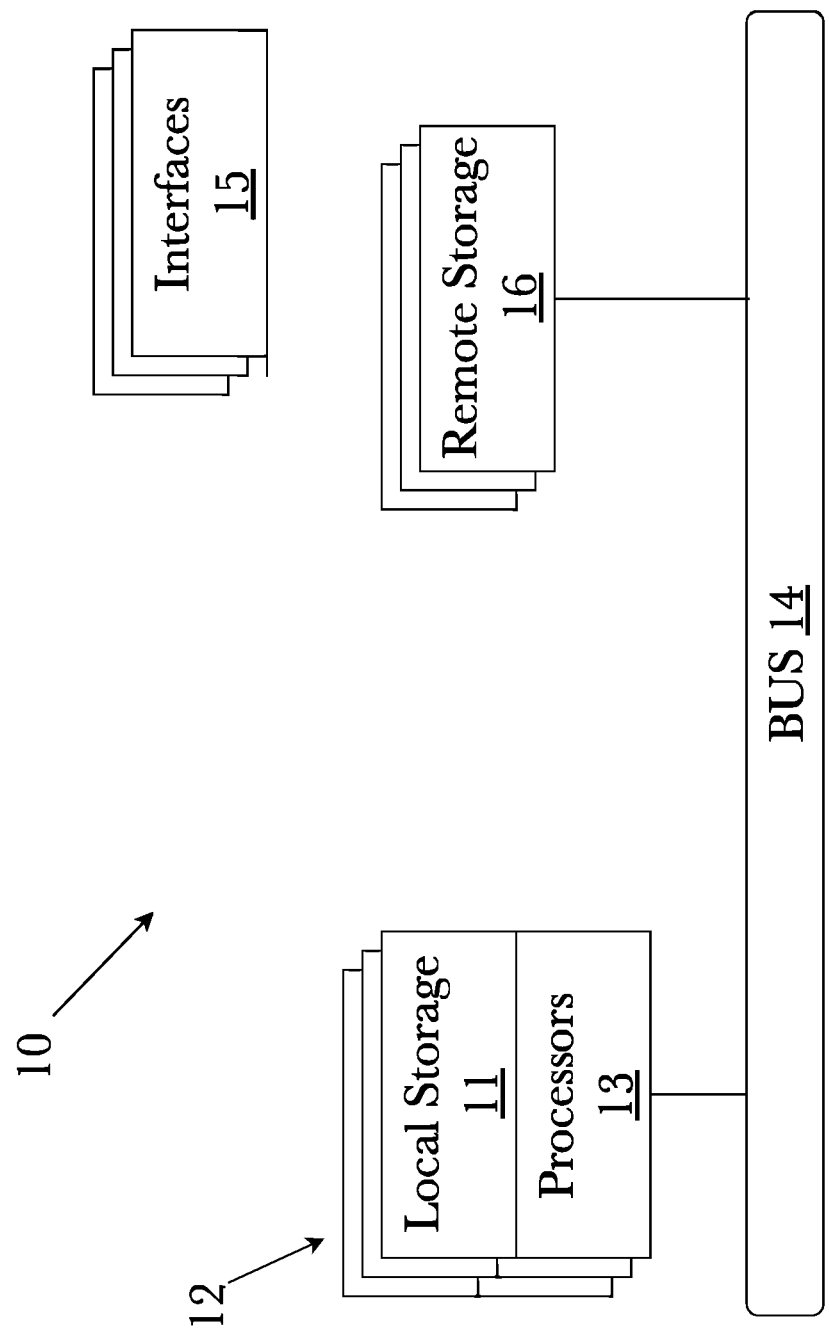
FIG. 21 is a block diagram illustrating an exemplary hardware architecture of a computing device.

Referring now to FIG. 21, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one aspect, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one aspect, a computing device 10 may be configured or designed to function as a server system utilizing CPU 12, local memory 11 and/or remote memory 16, and interface(s) 15. In at least one aspect, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some aspects, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a particular aspect, a local memory 11 (such as non-volatile random access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAPDRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one aspect, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 802.11 (WiFi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity AN hardware interfaces) and, in some instances, volatile and/or non-volatile memory (e.g., RAM).

Although the system shown in FIG. 21 illustrates one specific architecture for a computing device 10 for implementing one or more of the aspects described herein, it is by no means the only device architecture on which at least a portion of the features and techniques described herein may be implemented. For example, architectures having one or any number of processors 13 may be used, and such processors 13 may be present in a single device or distributed among any number of devices. In one aspect, a single processor 13 handles communications as well as routing computations, while in other aspects a separate dedicated communications processor may be provided. In various aspects, different types of features or functionalities may be implemented in a system according to the aspect that includes a client device (such as a tablet device or smartphone running client software) and server systems (such as a server system described in more detail below).

Regardless of network device configuration, the system of an aspect may employ one or more memories or memory modules (such as, for example, remote memory block 16 and local memory 11) configured to store data, program instructions for the general-purpose network operations, or other information relating to the functionality of the aspects described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device aspects may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files containing higher level code that may be executed by the computer using an interpreter (for example, scripts written in Python, Perl, Ruby, Groovy, or any other scripting language).

Figure 22:
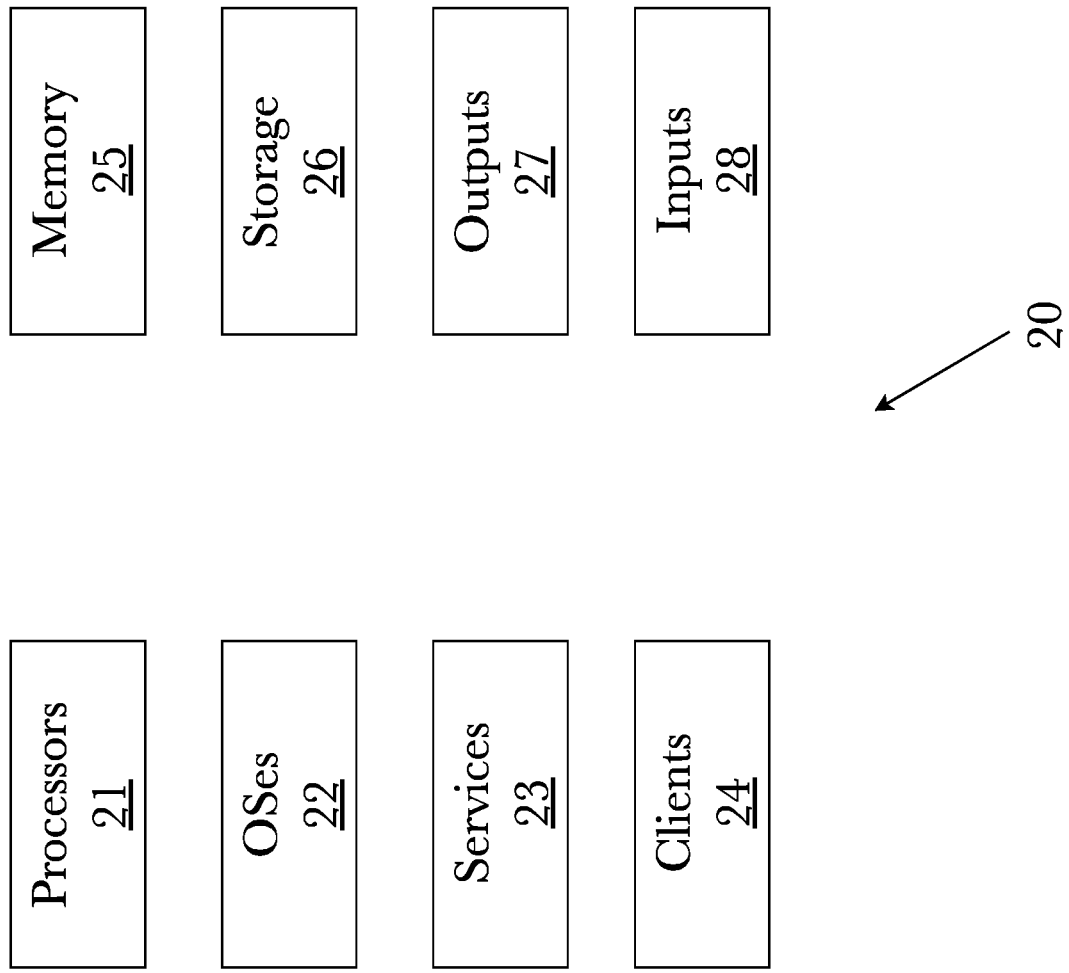
FIG. 22 is a block diagram illustrating an exemplary logical architecture for a client device.

In some aspects, systems may be implemented on a standalone computing system. Referring now to FIG. 22, there is shown a block diagram depicting a typical exemplary architecture of one or more aspects or components thereof on a standalone computing system. Computing device 20 includes processors 21 that may run software that carry out one or more functions or applications of aspects, such as for example a client application 24. Processors 21 may carry out computing instructions under control of an operating system 22 such as, for example, a version of MICROSOFT WINDOWS™ operating system, APPLE macOS™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above, referring to FIG. 21). Examples of storage devices 26 include flash memory, magnetic hard drive, CD-ROM, and/or the like.

Figure 23:
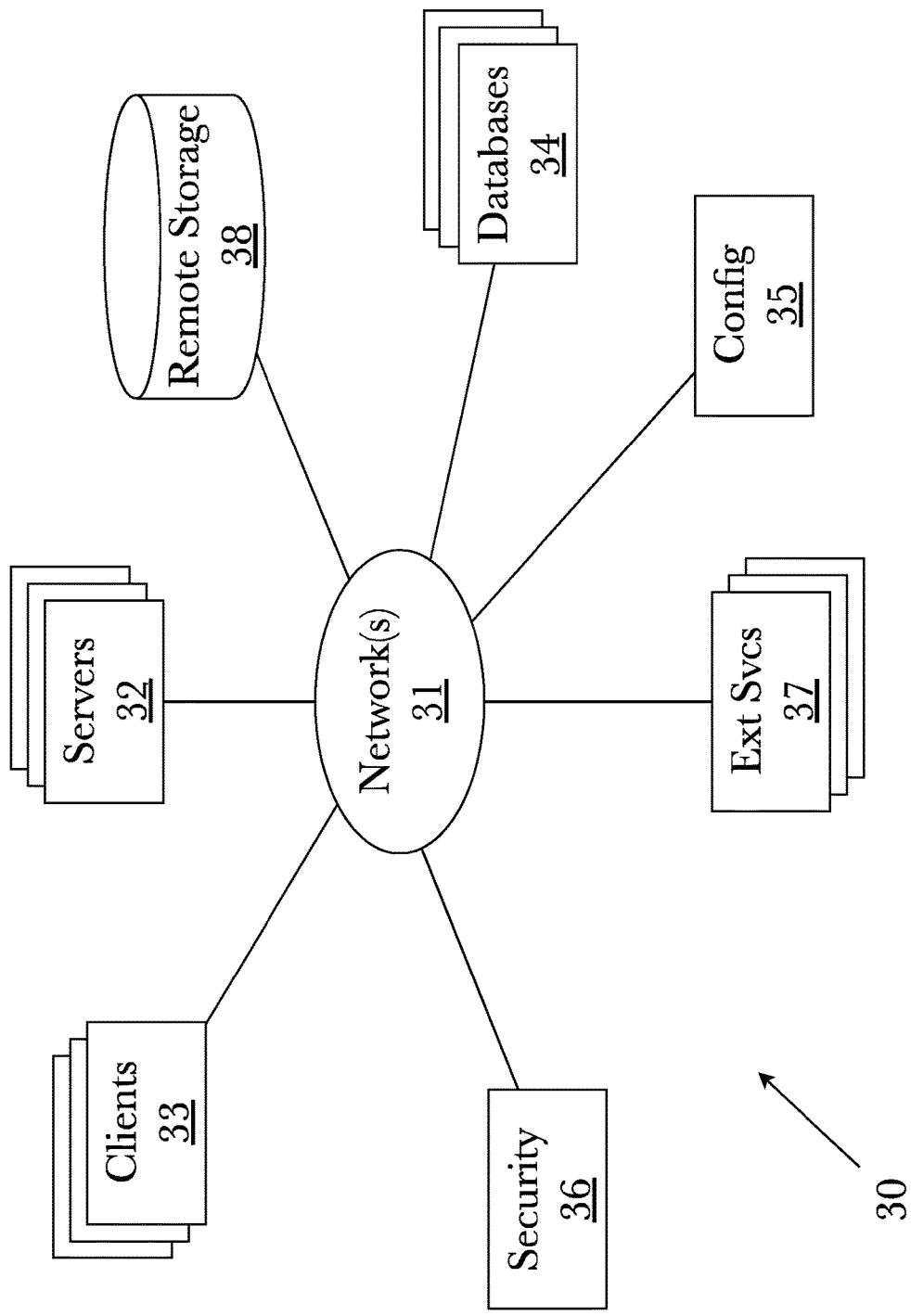
FIG. 23 is a block diagram showing an exemplary architectural arrangement of clients, servers, and external services.

In some aspects, systems may be implemented on a distributed computing network, such as one having any number of clients and/or servers. Referring now to FIG. 23, there is shown a block diagram depicting an exemplary architecture 30 for implementing at least a portion of a system according to one aspect on a distributed computing network. According to the aspect, any number of clients 33 may be provided. Each client 33 may run software for implementing client-side portions of a system; clients may comprise a system 20 such as that illustrated in FIG. 22. In addition, any number of servers 32 may be provided for handling requests received from one or more clients 33. Clients 33 and servers 32 may communicate with one another via one or more electronic networks 31, which may be in various aspects any of the Internet, a wide area network, a mobile telephony network (such as CDMA or GSM cellular networks), a wireless network (such as WiFi, WiMAX, LTE, and so forth), or a local area network (or indeed any network topology known in the art; the aspect does not prefer any one network topology over any other). Networks 31 may be implemented using any known network protocols, including for example wired and/or wireless protocols.

In addition, in some aspects, servers 32 may call external services 37 when needed to obtain additional information, or to refer to additional data concerning a particular call. Communications with external services 37 may take place, for example, via one or more networks 31. In various aspects, external services 37 may comprise web-enabled services or functionality related to or installed on the hardware device itself. For example, in one aspect where client applications 24 are implemented on a smartphone or other electronic device, client applications 24 may obtain information stored in a server system 32 in the cloud or on an external service 37 deployed on one or more of a particular enterprise's or user's premises. In addition to local storage on servers 32, remote storage 38 may be accessible through the network(s) 31.

In some aspects, clients 33 or servers 32 (or both) may make use of one or more specialized services or appliances that may be deployed locally or remotely across one or more networks 31. For example, one or more databases 34 in either local or remote storage 38 may be used or referred to by one or more aspects. It should be understood by one having ordinary skill in the art that databases in storage 34 may be arranged in a wide variety of architectures and using a wide variety of data access and manipulation means. For example, in various aspects one or more databases in storage 34 may comprise a relational database system using a structured query language (SQL), while others may comprise an alternative data storage technology such as those referred to in the art as "NoSQL" (for example, HADOOP CASSANDRA™, GOOGLE BIGTABLE™, and so forth). In some aspects, variant database architectures such as column-oriented databases, in-memory databases, clustered databases, distributed databases, or even flat file data repositories may be used according to the aspect. It will be appreciated by one having ordinary skill in the art that any combination of known or future database technologies may be used as appropriate, unless a specific database technology or a specific arrangement of components is specified for a particular aspect described herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, some aspects may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with aspects without limitation, unless a specific security 36 or configuration system 35 or approach is specifically required by the description of any specific aspect.

Figure 24:
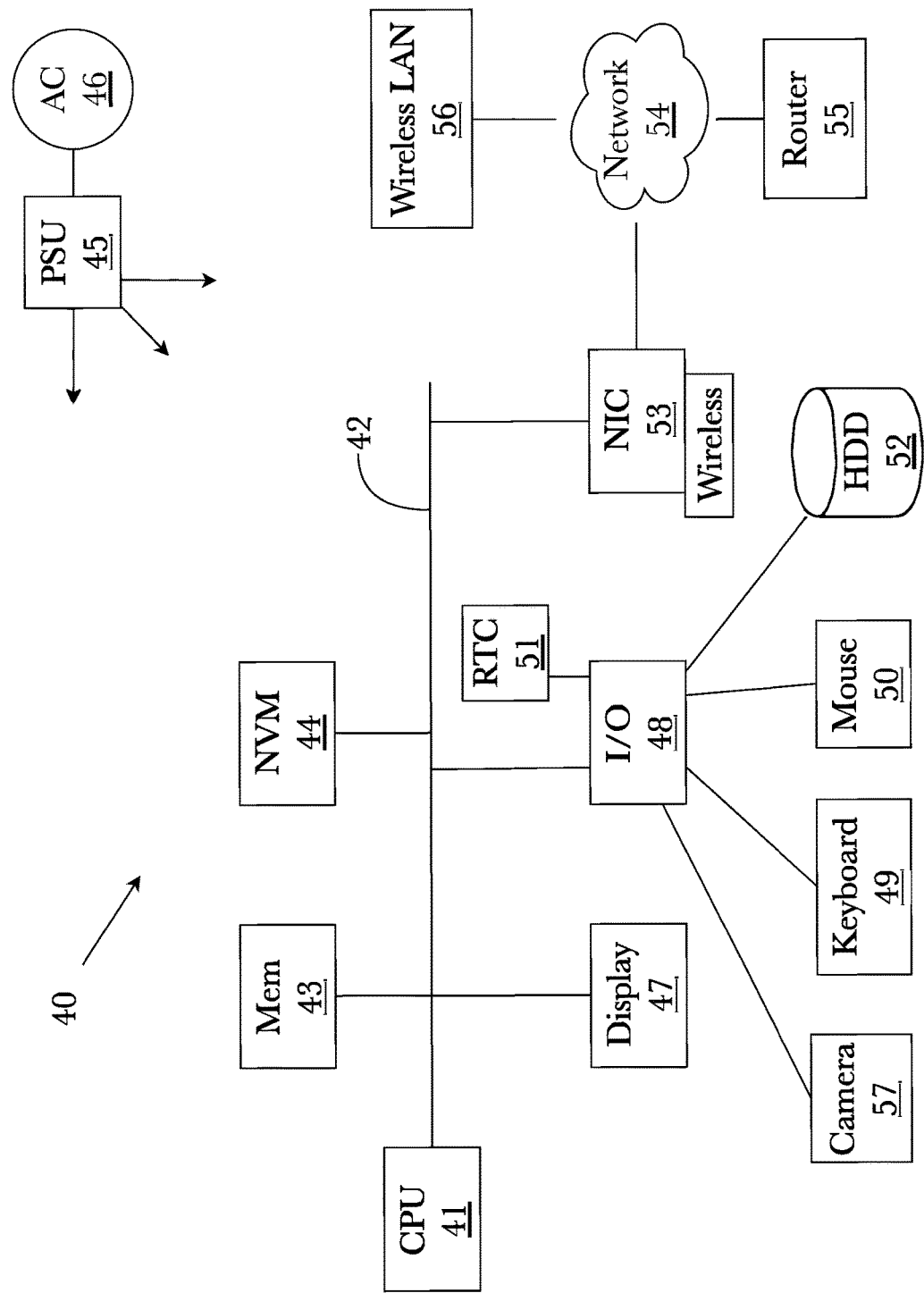
FIG. 24 is another block diagram illustrating an exemplary hardware architecture of a computing device.

FIG. 24 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to peripherals such as a keyboard 49, pointing device 50, hard disk 52, real-time clock 51, a camera 57, and other peripheral devices. NIC 53 connects to network 54, which may be the Internet or a local network, which local network may or may not have connections to the Internet. The system may be connected to other computing devices through the network via a router 55, wireless local area network 56, or any other network connection. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various aspects, functionality for implementing systems or methods of various aspects may be distributed among any number of client and/or server components. For example, various software modules may be implemented for performing various functions in connection with the system of any particular aspect, and such modules may be variously implemented to run on server and/or client components.

The skilled person will be aware of a range of possible modifications of the various aspects described above. Accordingly, the present invention is defined by the claims and their equivalents.

What is claimed is:

1. A system for storing, retrieving, and transmitting data in a highly compact format, comprising:
   a count sketch engine comprising a first plurality of programming instructions stored in a memory and operable on a processor of a computing device, wherein the programming instructions, when operating on the processor, cause the processor to:
   receive a set of training data comprising a plurality of data chunklets, each chunklet possessing an estimated frequency of occurrence;
   for each data chunklet within the set of training data, perform the following:
   update a set of hash tables corresponding to the data chunklet and a corresponding count of hash table entries;
   if the data chunklet is within a heap of data containing a set of the most frequent data chunklets, increment a count corresponding to the data chunklet; and
   if the data chunklet is not within the heap of data, estimate a frequency of occurrence for a value of the data chunked, and add the data chunklet to the heap of data while evicting a data chunklet having a lowest frequency of occurrence in the heap of data when the estimated frequency of occurrence is greater than the lowest frequency of occurrence; and
   generate a set of frequency data for the set of the most frequent data chunklets in the set of training data using data stored in heap of data;
   a Huffman tree creator generating a reference code library using set of frequency data for a plurality of the most frequent data chunklets in the set of training data, comprising a second plurality of programming instructions stored in the memory and operable on the processor of the computing device, wherein the programming instructions, when operating on the processor, cause the processor to:
   create a first Huffman binary tree based on the frequency of occurrences of each word in the set of training data;

assign a Huffman codeword to each data chunklet in the set of training data according to the first Huffman binary tree; and
construct the reference code library, wherein the reference library stores the reference codes and their corresponding words as key-value pairs in the library of key-value pairs;
wherein the reference code library comprises data chunklets and reference codes corresponding to the data chunklets;
a data deconstruction engine comprising a third plurality of plurality of programming instructions stored in the memory and operable on the processor of the computing device, wherein the programming instructions, when operating on the processor, cause the processor to:
receive run-time data;
deconstruct the run time data into a run time set of data chunklets;
retrieve the reference code for each chunklet from the reference code library;
where there is no reference code for a given chunklet, create a reference code, and store chunklet and its newly-created reference code in the reference code library; and
create a plurality of warplets representing the data, each warplet comprising a reference code to a chunklet in the reference code library; and
a data reconstruction engine comprising a fourth plurality of programming instructions stored in the memory and operable on the processor of the computing device, wherein the programming instructions, when operating on the processor, cause the processor to:
receive the plurality of warplets representing the data;
retrieve the chunklet corresponding to the reference code in each warplet from the reference code library; and
assemble the chunklets to reconstruct the data.

2. The system of claim 1, wherein the set of hash tables comprises a uniform random sample of data values and a corresponding count of a number of occurrences of the data value that have been processed from the training set data.

3. The system of claim 1, wherein the heap of data comprises a list of chunklet data value entries of the most frequency data values from within extracted data chunklets, each chunklet data value entry comprises a data value, a count of occurrences, and an estimated frequency of occurrence value.

4. The system of claim 3, wherein the heap of data contains an entry for each data value corresponding to a received data chunklet within the set of the most frequent data chunklets in the set of training data.

5. The system of claim 4, wherein the set of the most frequent data chunklets in the set of training data generates the reference code library.

6. A method for storing, retrieving, and transmitting data in a highly compact format, comprising the steps of:
receiving a set of training data comprising a plurality of training data chunklets, where each training data chunklet possess an estimated frequency of occurrence;
for each training data chunklet, perform the following:
update a set of hash tables corresponding to the training data chunklet and a corresponding count of hash table entries;
if the training data chunklet is within a heap of data containing a set of the most frequent training data chunklet, increment a count corresponding to the training data chunklet; and
if the training data chunklet is not within the heap of data, estimate a frequency of occurrence for a value of the training data chunklet, and add the training data chunklet to the heap of data while evicting a training data chunklet having a lowest frequency of occurrence in the heap of data when the estimated frequency of occurrence is greater than the lowest frequency of occurrence;
generating a set of frequency data for the set of the most frequent training data chunklet in the set of training data using data stored in heap of data;
generating a reference code library using set of frequency data for a plurality of the most frequent training data chunklet, where the reference code library comprises training data chunklets and reference codes corresponding to the training data chunklets;
receiving run time data;
deconstructing the run time data into a plurality of data chunklets;
retrieving the reference code for each chunklet from the reference code library;
where there is no reference code for a given chunklet, creating a reference code, and storing chunklet and its newly-created reference code in the reference code library;
creating a plurality of warplets representing the data, each warplet comprising a reference code to a chunklet in the library;
receiving the plurality of warplets representing the data;
retrieving the chunklet corresponding to the reference code in each warplet from the reference code library; and
assembling the chunklets to reconstruct the data.

7. The method of claim 6, wherein the set of hash tables comprises a uniform random sample of data values and a corresponding count of a number of occurrences of the data value that have been processed from the training set data.

8. The method of claim 6, wherein the heap of data comprises a list of chunklet data value entries of the most frequency data values from within extracted data chunklets, each chunklet data value entry comprises a data value, a count of occurrences, and an estimated frequency of occurrence value.

9. The method of claim 8, wherein the heap of data contains an entry for each data value corresponding to a received data chunklet within the set of the most frequent data chunklets in the set of training data.

10. The method of claim 9, wherein the set of the most frequent data chunklets in the set of training data generates the reference code library.

* * * * *